(12) United States Patent
Patil et al.

(10) Patent No.: US 12,100,645 B2
(45) Date of Patent: Sep. 24, 2024

(54) INTEGRATED CIRCUIT (IC) PACKAGE EMPLOYING ADDED METAL FOR EMBEDDED METAL TRACES IN ETS-BASED SUBSTRATE FOR REDUCED SIGNAL PATH IMPEDANCE, AND RELATED FABRICATION METHODS

(71) Applicant: QUALCOMM Incorporated, San Diego, CA (US)

(72) Inventors: Aniket Patil, San Diego, CA (US); Hong Bok We, San Diego, CA (US); Joan Rey Villarba Buot, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 216 days.

(21) Appl. No.: 17/482,718

(22) Filed: Sep. 23, 2021

(65) Prior Publication Data
US 2023/0086094 A1 Mar. 23, 2023

(51) Int. Cl.
*H01L 23/498* (2006.01)
*H01L 21/48* (2006.01)

(52) U.S. Cl.
CPC .... *H01L 23/49838* (2013.01); *H01L 21/4846* (2013.01); *H01L 23/49822* (2013.01)

(58) Field of Classification Search
CPC ........... H01L 23/49838; H01L 21/4846; H01L 23/49822
See application file for complete search history.

(56) References Cited

U.S. PATENT DOCUMENTS

| 8,772,951 B1 | 7/2014 | Kim et al. |
| 10,418,316 B1 | 9/2019 | Lu |
| 2015/0062848 A1* | 3/2015 | Lee .......................... H01L 24/19 156/60 |

(Continued)

OTHER PUBLICATIONS

International Search Report and Written Opinion for International Patent Application No. PCT/US2022/075316, mailed Dec. 21, 2022, 13 pages.

(Continued)

*Primary Examiner* — Michael Jung
(74) *Attorney, Agent, or Firm* — Withrow & Terranova, PLLC

(57) ABSTRACT

Integrated circuit (IC) packages employing added metal for embedded metal traces in an ETS-based substrate for reduced signal path impedance. An IC package includes a package substrate and an ETS metallization layer disposed on the package substrate. To mitigate or offset an increase in impedance in longer signal paths between die circuitry and the package substrate that can result in decreased signaling speed and/or increased signal loss, added metal interconnects are coupled to embedded metal traces in the ETS metallization layer. Thus, embedded metal traces of the ETS metallization layer coupled to signal/ground signal paths of the die are increased in metal surface area. Increasing metal surface area of embedded metal traces coupled to the signal/ground signal paths of a die increases capacitance of such signal/ground signal paths. Increasing capacitance of signal/ground signal paths decreases impedance of the signal/ground signal paths to mitigate or reduce signaling delay and/or loss.

22 Claims, 16 Drawing Sheets

(56) References Cited

U.S. PATENT DOCUMENTS

| | | | |
|---|---|---|---|
| 2018/0145017 A1* | 5/2018 | Tsai | H01L 21/486 |
| 2018/0240743 A1 | 8/2018 | Lee et al. | |
| 2018/0350630 A1* | 12/2018 | Kang | H01L 23/13 |
| 2019/0035753 A1 | 1/2019 | Shih et al. | |
| 2019/0252305 A1 | 8/2019 | Peng et al. | |
| 2020/0013706 A1 | 1/2020 | Kang et al. | |
| 2020/0335443 A1 | 10/2020 | Sun Zhou et al. | |
| 2020/0411432 A1* | 12/2020 | Kanbe | H01L 21/76841 |
| 2021/0057352 A1 | 2/2021 | Agarwal et al. | |
| 2023/0118028 A1 | 4/2023 | Kim et al. | |
| 2023/0217593 A1 | 7/2023 | Nam et al. | |

OTHER PUBLICATIONS

U.S. Appl. No. 17/451,302, filed Oct. 18, 2021.

\* cited by examiner

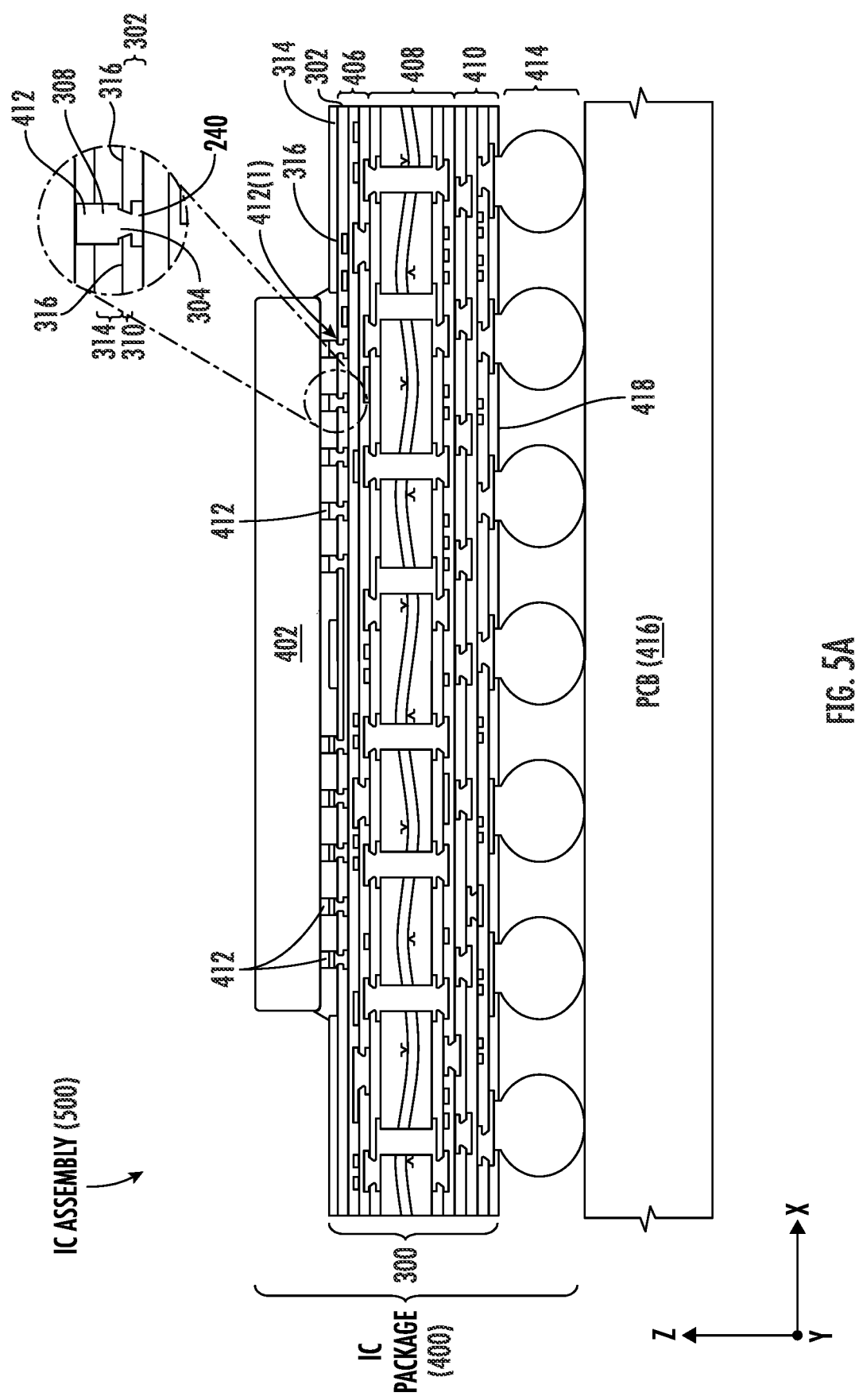

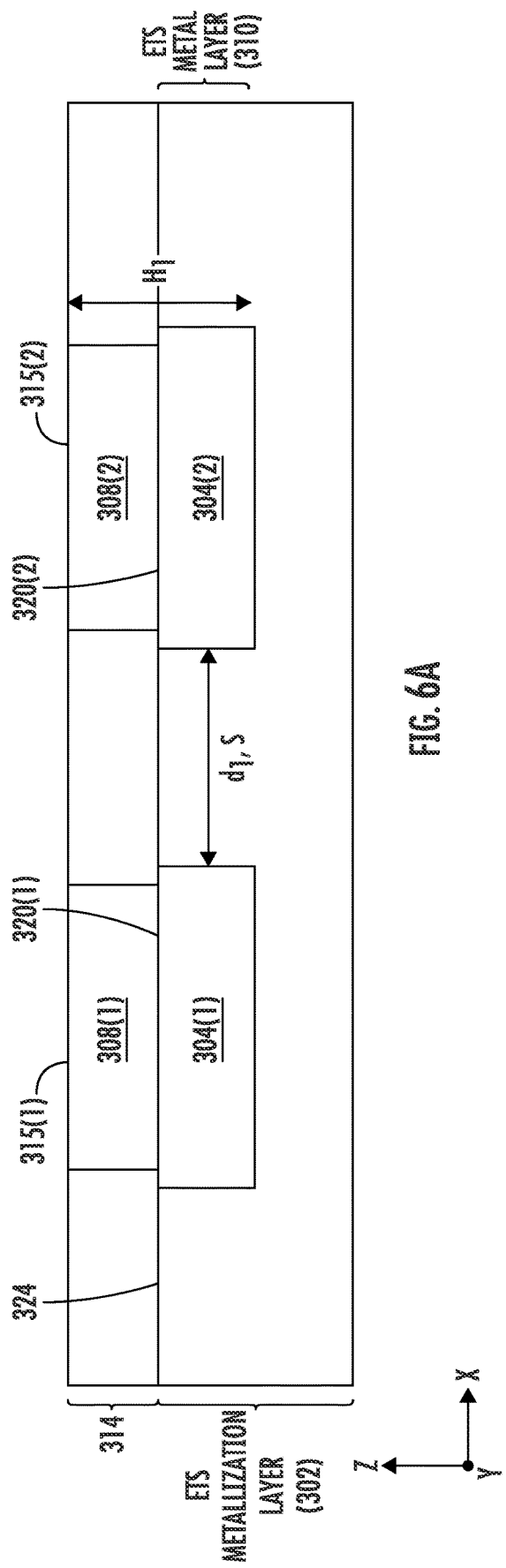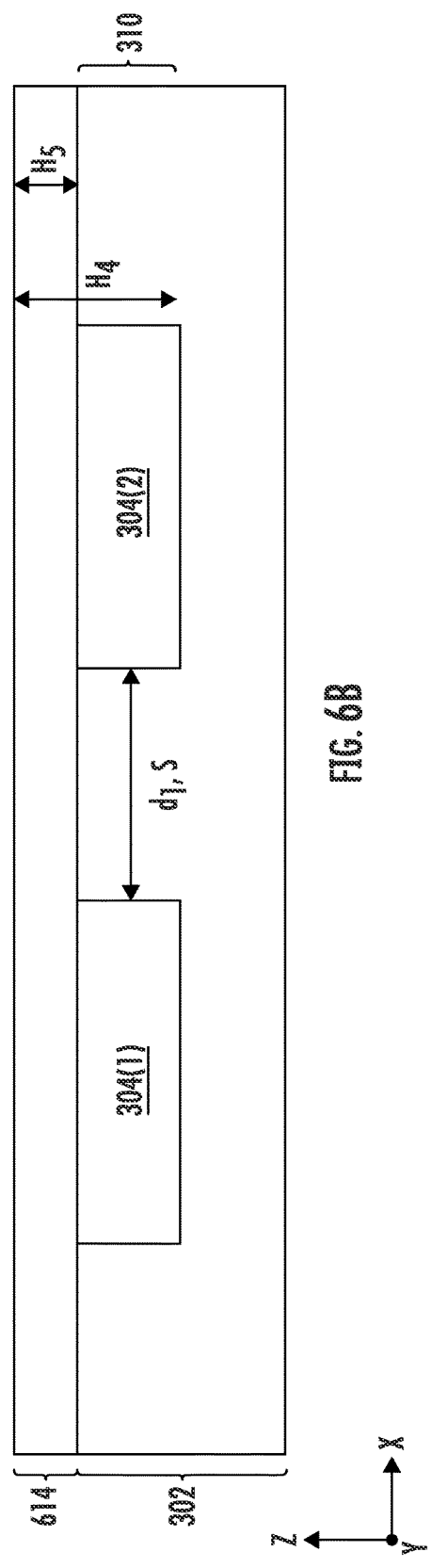
FIG. 6A
FIG. 6B

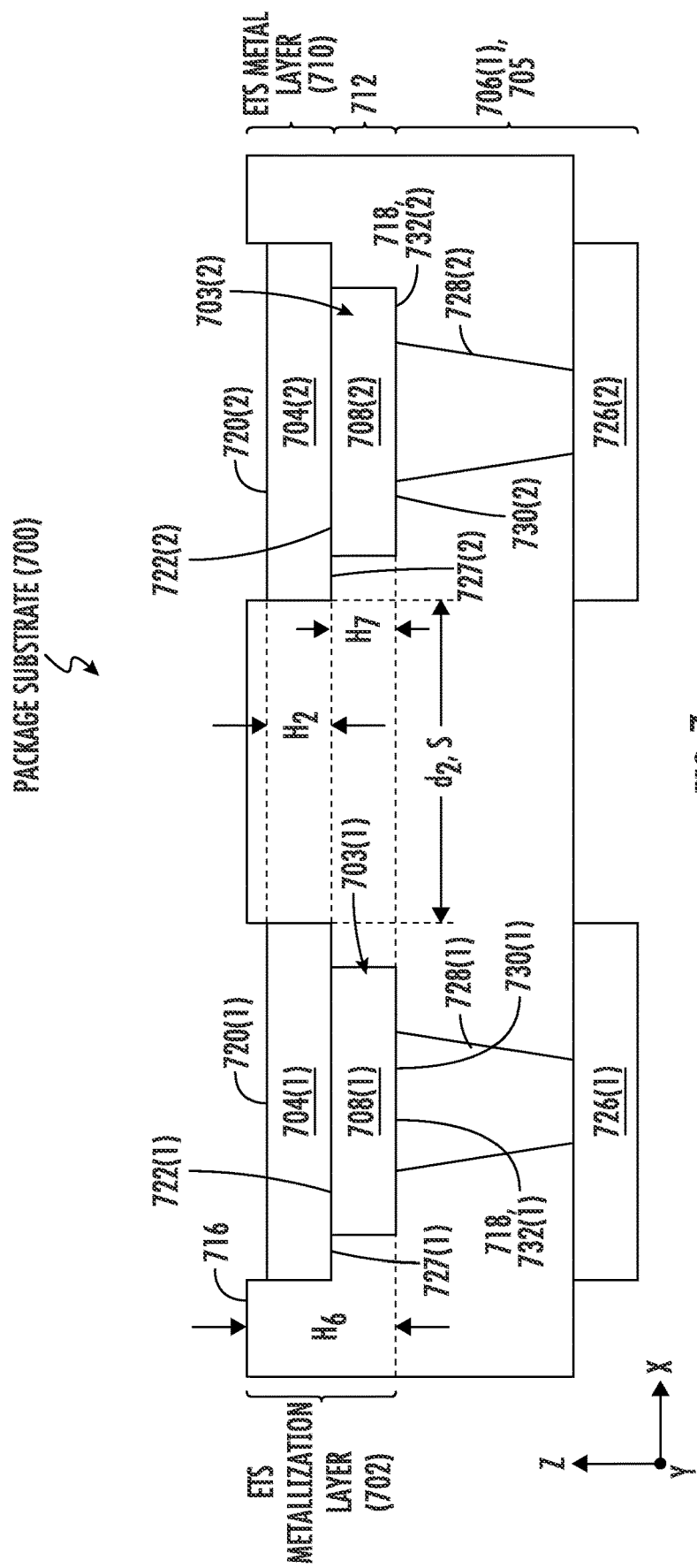

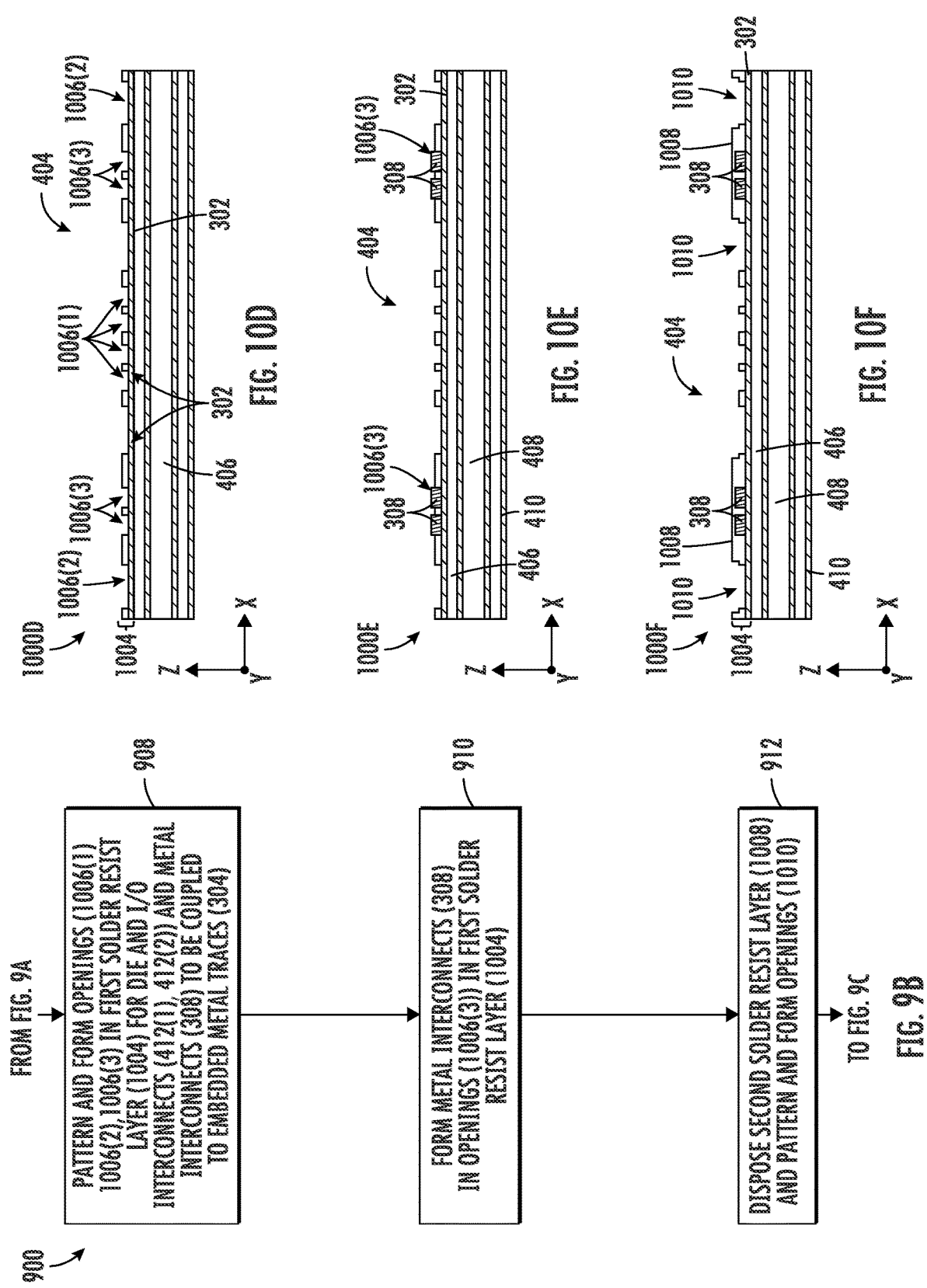

INTEGRATED CIRCUIT (IC) PACKAGE EMPLOYING ADDED METAL FOR EMBEDDED METAL TRACES IN ETS-BASED SUBSTRATE FOR REDUCED SIGNAL PATH IMPEDANCE, AND RELATED FABRICATION METHODS

BACKGROUND

I. Field of the Disclosure

The field of the disclosure relates to integrated circuit (IC) packages, and more particularly to design and manufacture of package substrates that support signal routing to a semiconductor die(s) in the IC package.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). The package substrate includes one or more metallization layers that include metal interconnects (e.g., metal traces, metal lines) with vertical interconnect accesses (vias) coupling the metal interconnects together between adjacent metallization layers to provide electrical interfaces between the die(s). The die(s) is electrically interfaced to metal interconnects exposed in a top or outer layer of the package substrate to electrically couple the die(s) to the metal interconnects of the package substrate. The package substrate includes an outer metallization layer coupled to external metal interconnects (e.g., solder bumps) to provide an external interface between the die(s) in the IC package for mounting the IC package on a circuit board to interface the die(s) with other circuitry. The package substrate may include an embedded trace substrate (ETS) (or include a thin ETS metallization layer) adjacent to the die to facilitate higher density bump/solder joints for coupling the die(s) to the package substrate.

Some IC packages are known as "hybrid" IC packages, which include multiple die packages with respective dies for different purposes or applications. For example, a hybrid IC package may an application die, such as a communications modem or processor (including a system). The hybrid IC package could also include, for example, one or more memory dies to provide memory to support data storage and access by the application die. Multiple dies could be disposed in a single die layer and disposed adjacent to each other in a horizontal direction on a package substrate in the IC package. The multiple dies could also be provided in their own respective die packages that are stacked on top of each other within an overall IC package with an interposer disposed therebetween to support providing electrical connections between the stacked dies in the package. Stacked die packages may be desired to reduce the cross-sectional area of the package. In a stacked die IC package, a first, bottom die directly supported on a package substrate is electrically coupled through die interconnects to metal interconnects in an upper metallization layer of the package substrate. Other stacked dies that are not directly adjacent to the package substrate in the IC package can be electrically coupled to the package substrate by wire bonds and/or intermediate interposers to provide die-to-die (D2D) connections between the multiple stacked dies.

A die in an IC package may include high speed input/output (HSIO) circuits (e.g., dynamic random access memory (DRAM)) where signal performance (i.e., high signaling speed and low signal loss) is critical for intended operation. For example, if a die in an IC package is a memory die, the IC package may need to support high speed memory access times to mitigate memory access latency. The speed and loss in signals muted to die in an IC package are negatively affected proportional to signal path length. It may be advantageous to dispose interface circuitry near the edge of the die to reduce the signal path length between the die and a package muting structure(s) (e.g., a package substrate, an interposer) of the IC package. For example, in a stacked die IC package, an interposer is aligned with a die to support shorter signal routing paths if the interface circuitry is located closer to the die edge. However, placing interface circuitry near the edge of a die can also increase the signal path length between the interface circuitry and other on-die circuits that are coupled to the interface circuitry in the die. Thus, it may be more "die friendly" to place interface circuitry in a die closer to the center of the die to reduce signal path lengths within the die, but such can be at the cost of longer signal paths between the interface circuitry and the routing structures of the IC package.

SUMMARY OF THE DISCLOSURE

Aspects disclosed herein include integrated circuit (IC) packages employing added metal for embedded metal traces in an ETS-based substrate for reduced signal path impedance. Related fabrication methods are also disclosed. In exemplary aspects, an IC package is provided that includes an ETS-based package substrate with an ETS metallization layer, that is a metallization layer that includes embedded metal traces. The ETS metallization layer facilitates providing higher density bump/solder joints with reduced line/spacing ratio (L/S) for electrically coupling a semiconductor die ("die") to the package substrate for signal routing. Metal embedded traces are formed in the ETS metallization layer that are electrically coupled to the die and metal interconnects in other metallization layers of the package substrate to provide signal routing paths for signal routing. The reduced L/S ratio made available by the ETS metallization layer reduces the metal surface area of the embedded metal traces versus other types of metal interconnects formed in other types of metallization layers in a package substrate, thus increasing resistance and impedance. Signal routing paths that include the embedded metal traces may also increase in impedance due to more die-friendly, centric placement of interface circuits in a die that result in longer length signal routing paths in the IC package. An increase in impedance of a signal routing path proportionally reduces signal performance by decreasing signaling speed and increasing signal loss.

To mitigate or offset an increase in impedance in signal paths between circuitry in the die and the package substrate, exemplary aspects disclosed herein include providing added metal interconnects coupled to embedded metal traces in the ETS metallization layer of the package substrate. In this manner, embedded metal traces of the ETS metallization layer that are part of the signal/ground signal paths of the die are increased in metal surface area. Increasing the metal surface area of the embedded metal traces coupled to the signal/ground signal paths of a die increases the capacitance of such signal/ground signal paths. Increasing the capacitance of signal/ground signal paths decreases the impedance of the signal/ground signal paths, because impedance is inversely proportional to capacitance. Decreasing the impedance of signal/ground signal paths between the package substrate and the die offset to mitigate an increase in impedance may allow providing a more "die friendly" placement of interface circuitry in a die. "Die friendly" placement of interface circuitry in a die generally means placing the interface circuitry closer to the center of the die and less towards the edges of the die to reduce the signal path length between the interface circuitry and other on-die circuits.

The added metal interconnects could be added on top of the embedded metal traces in a vertical direction in the IC package such that the added metal interconnects are disposed between the ETS metallization layer and the die. This would avoid having to provide an ETS metallization layer and package substrate that is wider in the horizontal direction and a resulting increase in IC package width to accommodate increased metal surface area of the embedded metal traces. In this scenario, as an example, the added metal interconnects could be added in a separate layer, such as solder resist layer that is disposed on the ETS metallization layer in a vertical direction when fabricating the package substrate, as a non-limiting example. The non-etched portions of the solder resist layer may be left resident in the IC package as part of its fabrication, such that placing the metal additions in the solder resist layer does not contribute to an increase in overall height of the IC package. Alternatively, the metal additions could be coupled to the embedded metal traces below the ETS interconnects such that the ETS embedded metal traces still form the metal interconnects between the ETS metallization layer and the die. In this scenario, the added metal interconnects could be added in an insulating layer in the ETS metallization layer below its ETS metal layer where there embedded metal traces are formed, and/or in addition or in place of vertical interconnect accesses (vias) coupling the embedded metal traces to metal interconnects in an adjacent, underlying metallization layer in the package substrate. In this instance, these vias could be expanded in a cross-sectional area to increase the metal surface area of the embedded metal traces. As one non-limiting example, the added metal interconnects provided for the embedded metal trace could include additional metal plating, such as copper plating. The added metal interconnects could also be additional metal traces or lines formed in an adjacent layer to the ETS metallization layer that are coupled to the embedded metal traces.

In this regard, in one exemplary aspect, an IC package is provided. The IC package comprises a package substrate. The package substrate comprises a plurality of metallization layers. The plurality of metallization layers comprises a first metallization layer comprising one or more first metal interconnects, and a second metallization layer. The second metallization layer comprises a second metal layer and one or more metal traces embedded in the second metal layer. The package substrate also comprises a third layer disposed adjacent to the second metal layer, the third layer comprising one or more third metal interconnects each coupled to a metal trace among the one or more metal traces.

In another exemplary aspect, a method of fabricating an IC package is provided. The method includes forming a package substrate comprising forming a plurality of metallization layers. Forming a plurality of metallization layers comprises forming a first metallization layer comprising one or more first metal interconnects and forming a second metallization layer. The second metallization layer comprises a second metal layer and one or more metal traces embedded in the second metal layer. The method also comprises coupling each of the one or more metal traces to a first metal interconnect among the one or more metal interconnects. The method also comprises forming a third layer disposed adjacent to the second metal layer, the third layer comprising one or more third metal interconnects. The method also comprises coupling each of the one or more metal interconnects to a metal trace among the one or more metal traces.

BRIEF DESCRIPTION OF THE FIGURES

FIG. 5A is a side view of an exemplary IC assembly that includes the IC package in FIG. 4;

FIG. 6A is a side of a solder resist layer disposed on an ETS metallization layer in FIG. 3 that includes added metal interconnects coupled to embedded metal traces;

FIG. 6B is a side view solder resist layer on an ETS metallization layer that does not include metal interconnects coupled to embedded metal traces;

FIG. 7 is a side view of an alternative structure of added metal interconnects provided in a dielectric material of the ETS metallization layer below and coupled to the embedded metal traces, to reduce impedance of signal paths that include the embedded metal traces;

FIGS. 9A-9C is a flowchart illustrating another exemplary fabrication process of fabricating the IC package that includes an ETS metallization layer formed in a package substrate, wherein interconnects are provided and coupled to embedded metal traces of the ETS metallization layer to reduce impedance of signal paths that include the embedded metal traces, including but not limited to the IC packages and related structures in FIGS. 3A-5 and 7;

FIGS. 10A-10G are exemplary fabrication stages during fabrication of an IC package according to the fabrication process in FIGS. 9A-9C;

DETAILED DESCRIPTION

Figure 1A:
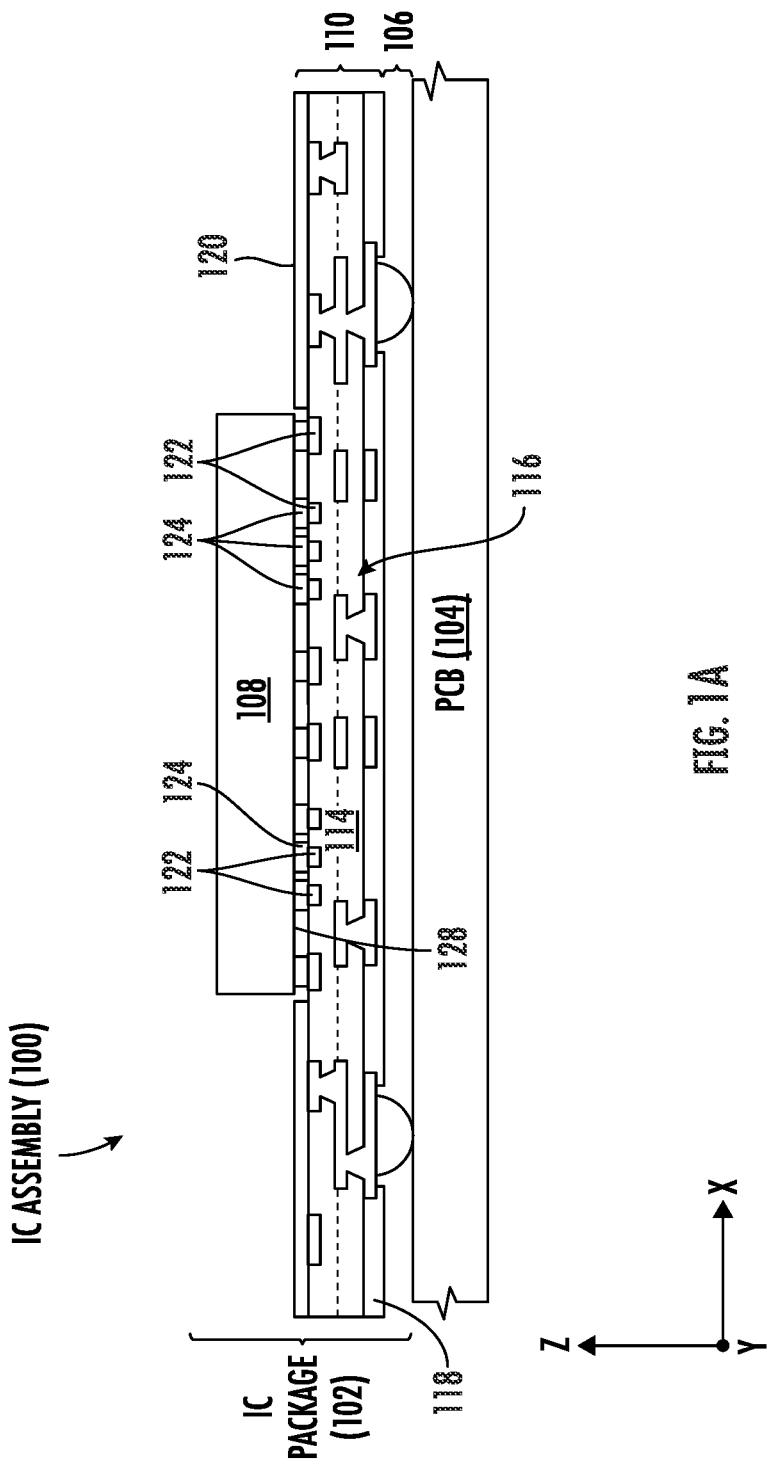
FIGS. 1A and 1B are side views of an integrated circuit (IC) package that includes a semiconductor die ("die") mounted on a package substrate that includes an embedded trace substrate (ETS) to provide an electrical interface between the package substrate and the die.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) packages employing added metal for embedded metal traces in an ETS-based substrate for reduced signal path impedance. Related fabrication methods are also disclosed. In exemplary aspects, an IC package is provided that includes an ETS-based package substrate with an ETS metallization layer, that is a metallization layer that includes embedded metal traces. The ETS metallization layer facilitates providing higher density bump/solder joints with reduced line/spacing ratio (L/S) for electrically coupling a semiconductor die ("die") to the package substrate for signal routing. Metal embedded traces are foamed in the ETS metallization layer that are electrically coupled to the die and metal interconnects in other metallization layers of the package substrate to provide signal routing paths for signal routing. The reduced L/S ratio made available by the ETS metallization layer reduces the metal surface area of the embedded metal traces versus other types of metal interconnects formed in other types of metallization layers in a package substrate, thus increasing resistance and impedance. Signal routing paths that include the embedded metal traces may also increase in impedance due to more die-friendly, centric placement of interface circuits in a die that result in longer length signal routing paths in the IC package. An increase in impedance of a signal routing path proportionally reduces signal performance by decreasing signaling speed and increasing signal loss.

To mitigate or offset an increase in impedance in signal paths between circuitry in the die and the package substrate, exemplary aspects disclosed herein include providing added metal interconnects coupled to embedded metal traces in the ETS metallization layer of the package substrate. In this manner, embedded metal traces of the ETS metallization layer that are part of the signal/ground signal paths of the die are increased in metal surface area. Increasing the metal surface area of the embedded metal traces coupled to the signal/ground signal paths of a die increases the capacitance of such signal/ground signal paths. Increasing the capacitance of signal/ground signal paths decreases the impedance of the signal/ground signal paths, because impedance is inversely proportional to capacitance. Decreasing the impedance of signal/ground signal paths between the package substrate and the die offset to mitigate an increase in impedance may allow providing a more "die friendly" placement of interface circuitry in a die. "Die friendly" placement of interface circuitry in a die generally means placing the interface circuitry closer to the center of the die and less towards the edges of the die to reduce the signal path length between the interface circuitry and other on-die circuits.

The added metal interconnects could be added on top of the embedded metal traces in a vertical direction in the IC package such that the added metal interconnects are disposed between the ETS metallization layer and the die. This would avoid having to provide an ETS metallization layer and package substrate that is wider in the horizontal direction and a resulting increase in IC package width to accommodate increased metal surface area of the embedded metal traces. In this scenario, as an example, the added metal interconnects could be added in a separate layer, such as solder resist layer that is disposed on the ETS metallization layer in a vertical direction when fabricating the package substrate, as a non-limiting example. The non-etched portions of the solder resist layer may be left resident in the IC package as part of its fabrication, such that placing the metal additions in the solder resist layer does not contribute to an increase in overall height of the IC package. Alternatively, the metal additions could be coupled to the embedded metal traces below the ETS interconnects such that the ETS embedded metal traces still form the metal interconnects between the ETS metallization layer and the die. In this scenario, the added metal interconnects could be added in an insulating layer in the ETS metallization layer below its ETS metal layer where there embedded metal traces are formed, and/or in addition or in place of vertical interconnect accesses (vias) coupling the embedded metal traces to metal interconnects in an adjacent, underlying metallization layer in the package substrate. In this instance, these vias could be expanded in a cross-sectional area to increase the metal surface area of the embedded metal traces. As one non-limiting example, the added metal interconnects provided for the embedded metal trace could include additional metal plating, such as copper plating. The added metal interconnects could also be additional metal traces or lines formed in an adjacent layer to the ETS metallization layer that are coupled to the embedded metal traces.

Before discussing examples of IC packages employing added metal interconnects on embedded metal traces in an ETS metallization layer of a package substrate for reduced signal path impedance starting at FIG. 3, an IC package that employs a package substrate with an ETS metallization layer that includes embedded metal traces without interconnects is first described in FIGS. 1A-2B below.

In this regard, FIG. 1A illustrates a schematic side view of a cross-section of an IC assembly 100 that includes an IC package 102 that is mounted to a printed circuit board (PCB) 104 using solder interconnects 106, such as solder balls. The IC package 102 includes a semiconductor die 108 (also referred to as "IC die 108" or "die 108") that is mounted to a package substrate 110 via a die-to-die bonding and/or underfill adhesive. The solder interconnects 106 are coupled to metal interconnections in the package substrate 110 to provide an electrical interface to the die 108 when the IC package 102 is mounted to the PCB 104.

Figure 1B:
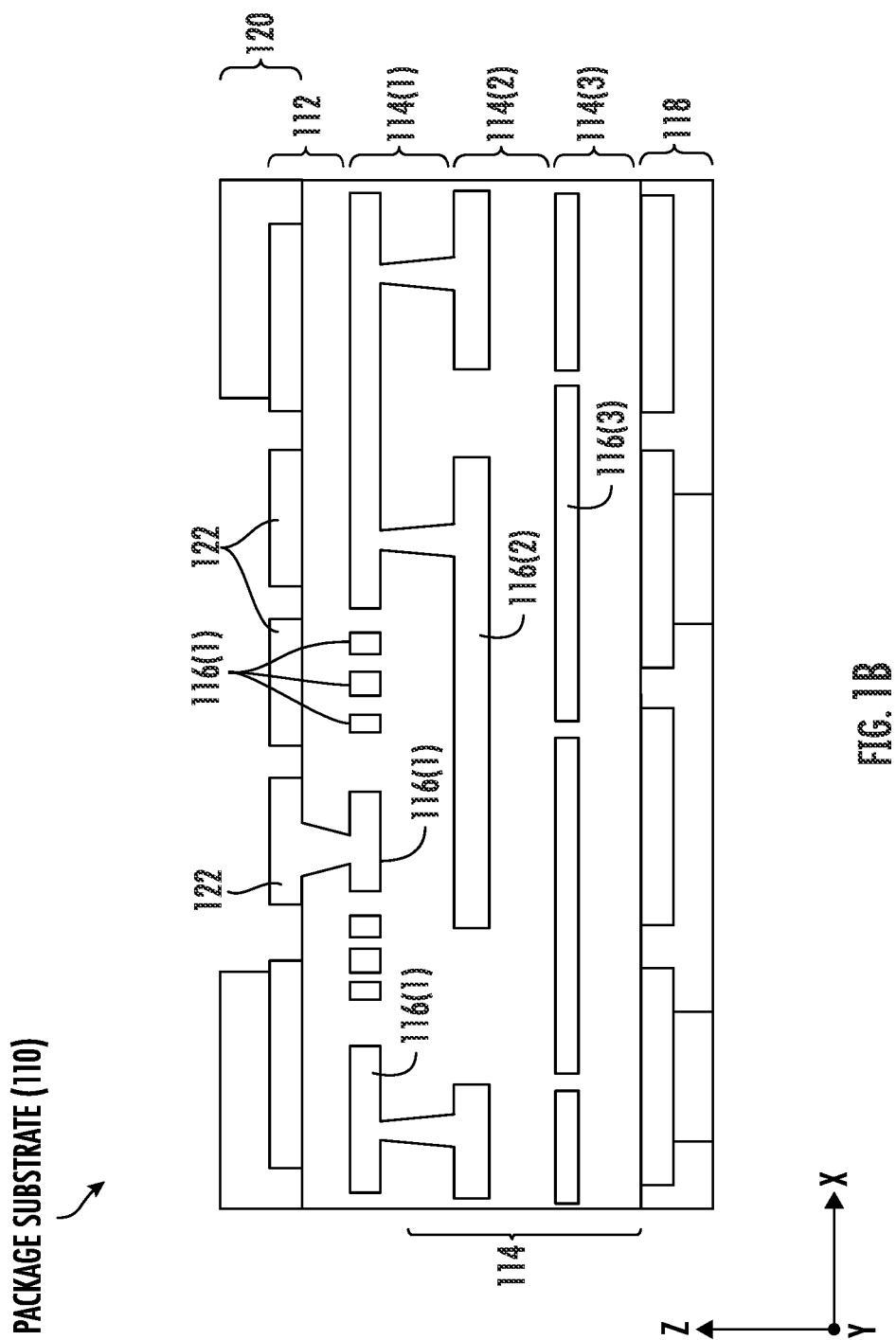

As also shown in FIGS. 1A and 1B, the package substrate 110 includes a plurality of insulating layers 114, 114(1)-114(3) comprised of a dielectric material that include embedded metal interconnects 116, 116(1)-116(3) (e.g., metal traces, metal lines). As shown in FIG. 1B, the package substrate 110 employs a dielectric material in the insulating layers 114(1)-114(3) to reduce or avoid warpage and damage. Each of the insulating layers 114(1)-114(3) includes a patterned metal layer and vias to provide the metal interconnects 116(1)-116(3). The package substrate 110 includes a first solder resist layer 118 and a second solder resist layer 120. As shown in FIG. 1A, solder interconnects 106 are formed in openings in the first solder resist layer 118 coupled to the metal interconnects 116(3). As shown in FIG. 1B, a plurality of embedded metal traces 122 in the ETS metallization layer 112 are coupled to the metal interconnects 116(1) in the ETS metallization layer 112 to provide electrical signal routing to the package substrate 110. The ETS metallization layer 112 is a metallization layer of the package substrate 110. As shown in FIG. 1A, raised metal interconnects 124 (e.g., interconnect solder/metal bumps) are formed in contact with the embedded metal traces 122 embedded in the ETS metallization layer 112. Die interconnects 126 (e.g., interconnect bumps) disposed on an active surface 128 of the die 108 are coupled to the raised metal interconnects 124, which are coupled to embedded metal traces 122 of the package substrate 110, to provide an electrical coupling between the die 108 and the package substrate 110.

Figure 2A:
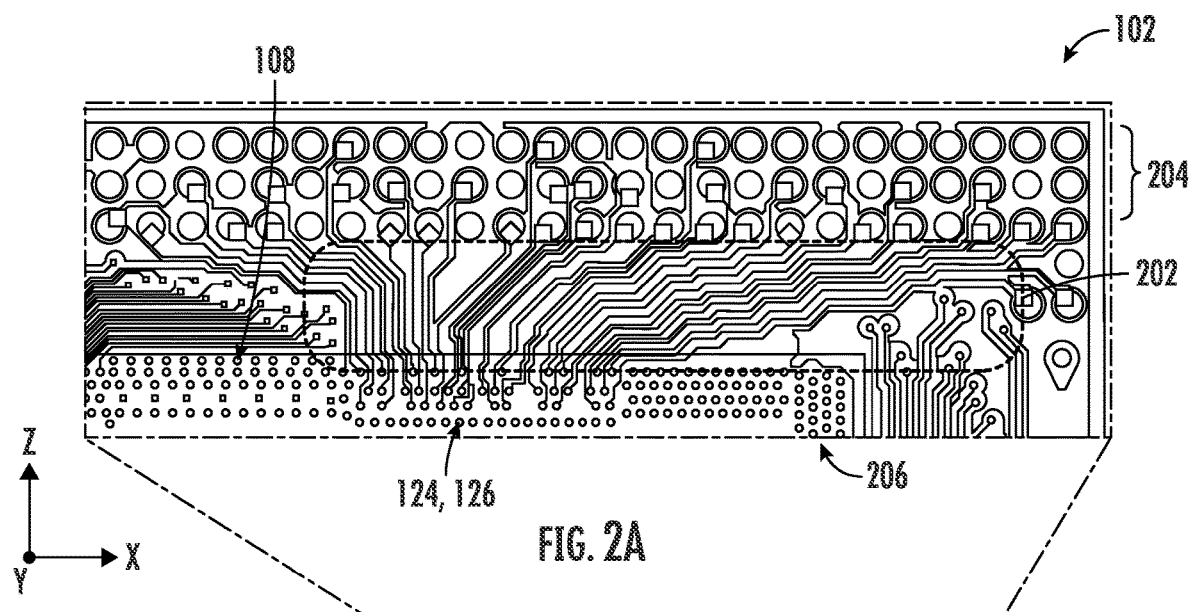
FIG. 2A is a close-up view of the top, right edge of an IC package.
Figure 2B:
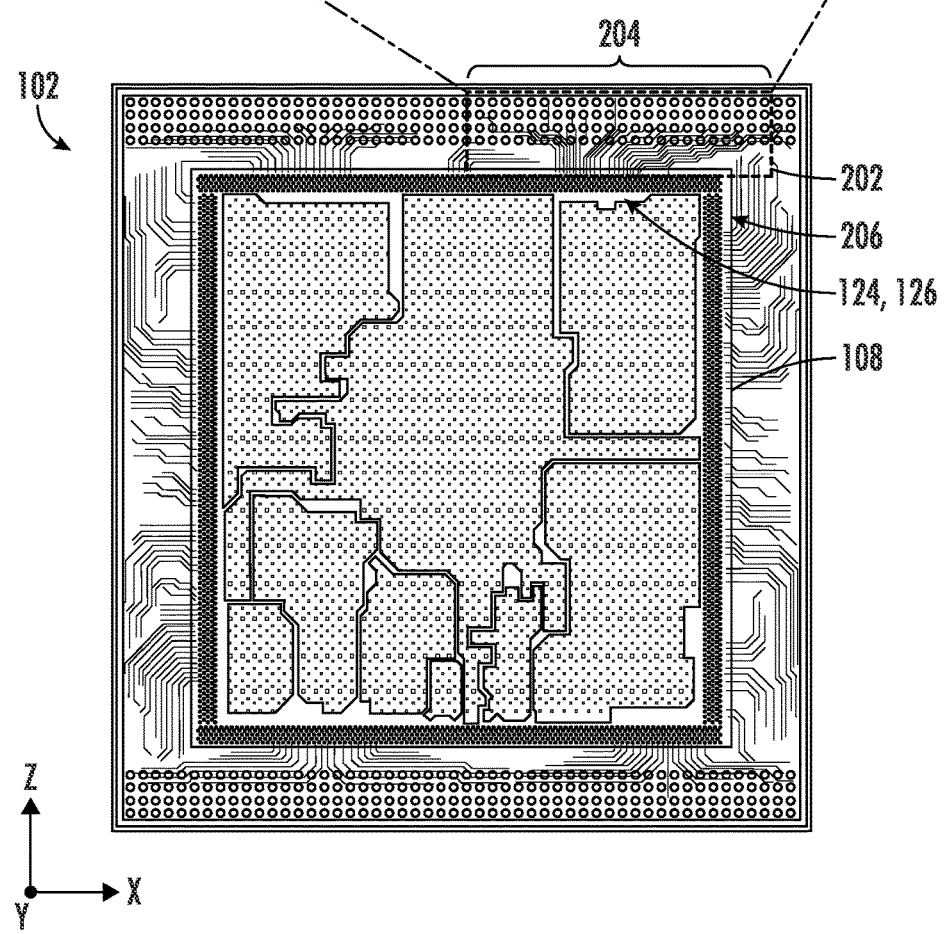
FIG. 2B is a top view of the IC package in FIG. 2A.

FIGS. 2A and 2B are top views of the IC package 102 in FIGS. 1A and 1B. FIG. 2A is a close-up view of the top, right edge of the IC package 102 shown in FIG. 2B. As shown in FIGS. 2A and 2B, metal traces 202 are muted from the raised metal interconnects 124 that are coupled to the die 108 through the die interconnects 126, to the connections 204 on the package substrate 110. For example, the metal traces 202 may be high speed input/output (I/O) signal paths coupled to metal traces 202, such as a high speed I/O (HSIO) circuit, that is integrated into the die 108 to be more "die friendly" to save silicon and associated costs.

However, as die size grows, the signal path lengths to the die also increase. Signaling speed and signal loss decrease and increase, respectively, in the die 108 proportional to signal path lengths of the metal traces 202. Signal performance (i.e., high signaling speed and low signal loss) may be critical for intended operation of the interface circuitry. For example, if the die 108 in the IC package 102 is a memory die, the IC package 102 may need to support high speed memory access times to mitigate memory access latency. A longer signal path length in the metal traces 202 has an increased impedance, which can reduce signaling speed and signal loss. For example, interface circuitry in the die 108 may have a target impedance of fifty (50) Ohms for interface signals. The metal traces 202 are longer in length that they otherwise would be if the interface circuitry in the die 108 were located closer to a right edge 206 of the die 108 in FIGS. 2A and 2B. It may be advantageous to dispose interface circuitry in the die 108 near the edge (e.g., the right edge 206) of the die 108 to reduce the signal path length of the metal traces 202 between the die 108 and the package substrate 110. However, placing interface circuitry near the edge 206 of the die 108 can also increase the signal path length of the metal traces 202 between the interface circuitry and other on-die circuits in the die 108 that are coupled to the interface circuitry in the die. Thus, it may be more "die friendly" to place interface circuitry in the die 108 closer to the center of the die 108 to reduce signal path lengths of metal traces within the die, but such can be at the cost of longer signal paths of the metal traces 202 between the interface circuitry and the package substrate 110.

In this regard, to mitigate or offset an increase in impedance in longer signal paths between circuitry in a die and an ETS-based package substrate that can result in a decrease in signaling speed and increase in signal loss, metal interconnects can be provided that are coupled to embedded metal traces in an ETS metallization layer of a package substrate to reduce or offset an increase in impedance. This may allow for more flexible placement of interface circuitry in a die. For example, interface circuitry may more easily be placed towards the center of the die for more friendly die placement, while being able to reduce and/or offset an increase in impedance of the signal paths that result in longer signal path lengths to the package substrate.

Figure 3:
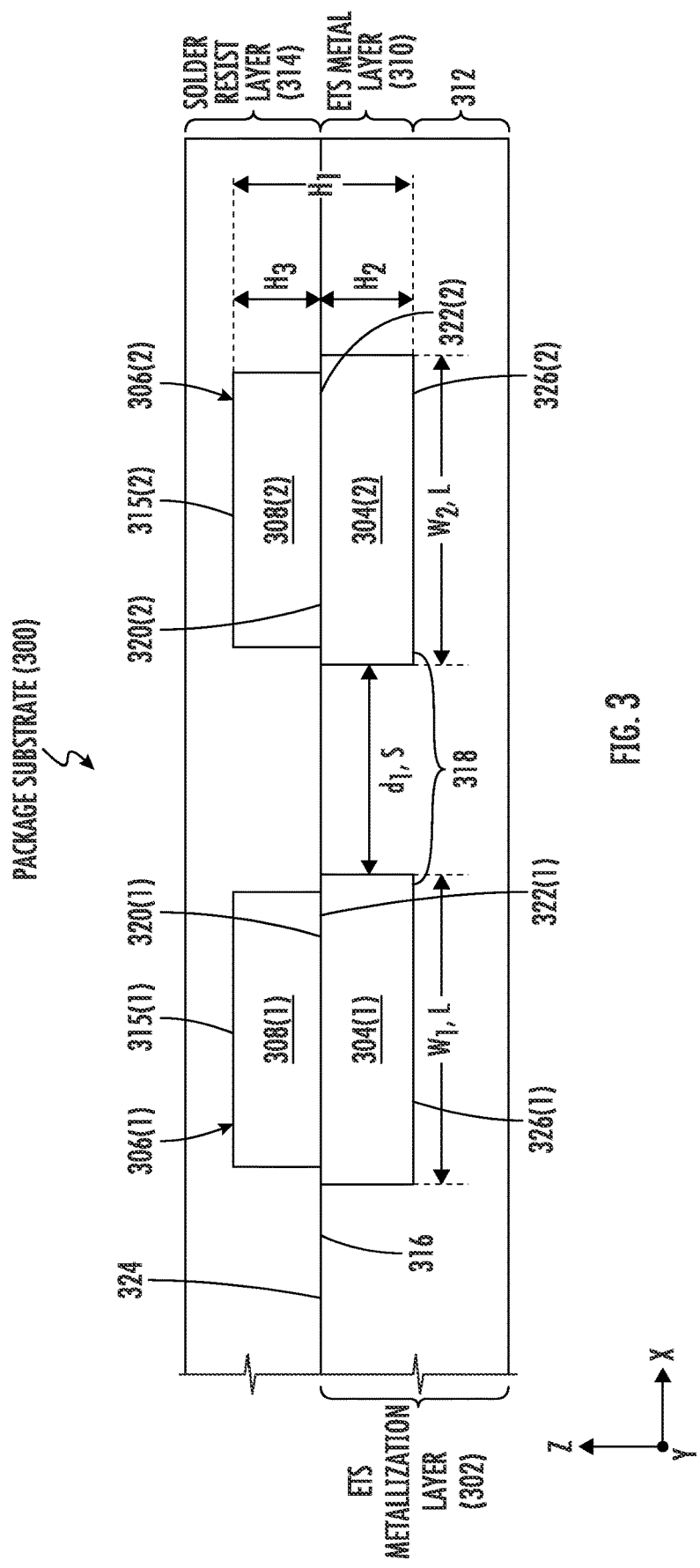
FIG. 3 is a side view of an embedded trace substrate (ETS) layer in a package substrate with embedded metal traces for providing interconnects to electrically couple a die to a package substrate, to provide an electrical interface between the die and the package substrate, wherein added metal interconnects are provided and coupled to embedded metal traces of the ETS metallization layer to increase the metal surface area of the embedded metal traces to increase their capacitance and thus reduce impedance of signal paths that include the embedded metal traces.

In this regard, FIG. 3 is a side view of a portion of a package substrate 300 that includes an ETS metallization layer 302 with embedded metal traces 304(1), 304(2) for providing interconnects to electrically couple a die to the package substrate 300. As discussed below, the ETS metallization layer 302 is a metallization layer in the package substrate 300. The ETS metallization layer 302 includes an ETS metal layer 310 disposed adjacent to an insulating layer 312. The ETS metal layer 310 includes the embedded metal traces 304(1), 304(2) embedded in a dielectric material therein. For example, a signal path that includes the embedded metal trace 304(1) could be an I/O signal path/node of a coupled die, and that includes the embedded metal trace 304(2) could be a ground plane/node of a coupled die. Note that only two (2) embedded metal traces 304(1), 304(2) are shown for illustrative purposes in FIG. 3, but an ETS metallization layer will typically have more embedded metal traces. The embedded metal traces 304(1), 304(2) can be metal traces, metal lines, metal posts, metal pillars, vertical interconnect accesses (vias), as examples. As discussed in more detail below, in this example, added metal 306(1), 306(2) of a metal material in the form of added metal interconnects 308(1), 308(2) are additionally provided and disposed in contact with the embedded metal traces 304(1), 304(2) disposed in an ETS metal layer 310. The ETS metal layer 310 is a metal layer in the ETS metallization layer 302. The metal interconnects 308(1), 308(2) are made of a metal material, such as copper for example. The metal interconnects 308(1), 308(2) can be provided in the form of metal traces, metal lines, metal blocks, etc. The metal interconnects 308(1), 308(2) can be formed by the disposition of a metal material in patterned openings disposed above the embedded metal traces 304(1), 304(2) in the ETS metal layer 310 in the vertical direction (Z-axis direction) as an example. The ETS metallization layer 302 includes the ETS metal layer 310 where the embedded metal traces 304(1), 304(1) are formed. The ETS metal layer 310 is disposed on an insulating layer 312 comprised of a dielectric material. The ETS metal layer 310 may have started out in fabrication as part of the insulating layer 312, but is designated as the ETS metal layer 310 in the portion of the insulating layer 312 where the embedded metal traces 304(1), 304(2) are formed.

The metal interconnects 308(1), 308(2) reduce impedance of signal paths that include the embedded metal traces 304(1), 304(2) as to compared to if the metal interconnects 308(1), 308(2) were not provided. The impedance of the embedded metal traces 304(1), 304(2) is reduced, because providing the metal interconnects 308(1), 308(2) increases the metal surface area of the embedded metal traces 304(1), 304(2), which in turn increases the capacitance of the embedded metal traces 304(1), 304(4). Impedance is inversely proportional to capacitance. The capacitance of the embedded metal traces 304(1), 304(4) is increased by the metal interconnects 308(1), 308(2) increasing the metal surface area of the embedded metal traces 304(1), 304(2), because capacitance of the embedded metal traces 304(1), 304(2) is proportional to the surface area 'A' of the metal of the combined embedded metal traces 304(1), 304(2) and metal interconnects 308(1), 308(2). The capacitance 'C' of the combined embedded metal traces 304(1), 304(4) and metal interconnects 308(1), 308(2) is $C=\varepsilon A/d_1$, where 'A' is the metal surface area, and '$d_1$' is the distance between the embedded metal traces 304(1), 304(2) as shown in FIG. 3.

Note that the capacitance of the embedded metal traces 304(1), 304(2) could also be increased by reducing the distance $d_1$ (spacing S) between the embedded metal traces 304(1), 304(2), because the embedded metal traces 304(1), 304(2) act as a parallel plate capacitor. However, reducing the distance $d_1$ between the embedded metal traces 304(1), 304(2) may not be desired, because the distance $d_1$ is controlled by the fabrication processes and technology used to fabricate the package substrate 300. Fabrication processes are subject to limitations that control a minimum distance or pitch according to the minimum line/spacing ratio (L/S) (e.g., 5.0 micrometers (μm)/5.0 μm) between adjacent metal lines, such as embedded metal traces 304(1), 304(2). This distance $d_1$ limitation between the embedded metal traces 304(1), 304(2) is also a function of placement and alignment tolerances of the fabrication process to avoid short circuits between the embedded metal traces 304(1), 304(2).

Also, in the example package substrate 300 and ETS metallization layer 302 in FIG. 3, the metal interconnects 308(1), 308(2) could be disposed on top of the embedded metal traces 304(1), 304(1) in the ETS metal layer 310 in a vertical direction (Z-axis direction) of the package substrate 300. This is opposed to increasing the width $W_1$, $W_2$ (line width L) of the embedded metal traces 304(1), 304(2) in the horizontal directions (X- and/or Y-axes directions) in the ETS metallization layer 302. Increasing the line width L of the embedded metal traces 304(1), 304(2) in the horizontal directions (X- and/or Y-axes directions) in the ETS metallization layer 302 may increase the overall width of the package substrate 300, resulting in an increase of the IC package width in an undesired manner. By disposing the metal interconnects 308(1), 308(2) adjacent to the embedded metal traces 304(1), 304(2) in the vertical direction (Z-axis direction) in this example, an increase in width of the ETS metallization layer 302 and package substrate 300 may be avoided. However, disposing the metal interconnects 308(1), 308(2) adjacent to the embedded metal traces 304(1), 304(2) in the vertical direction (Z-axis direction) could increase the height of the package substrate 300 and thus the overall height of the IC package including the package substrate 300. For example, as shown in FIG. 3, the overall height $H_1$ of the metal interconnects 308(1), 308(2) disposed on the embedded metal traces 304(1), 304(2) is a combination of the individual respective heights $H_2$, $H_3$ of the embedded metal traces 304(1), 304(2) with the metal interconnects 308(1), 308(2) disposed therein.

In this example, to avoid or mitigate an increase in the overall height of the package substrate and the IC package in which the package substrate 300 is provided, the metal interconnects 308(1), 308(2) are disposed in a solder resist layer 314 as another layer, outside of the ETS metal layer 310. The metal interconnects 308(1), 308(2) can be formed in patterned openings adjacent to the embedded metal traces 304(1), 304(2) as separate metal structures or metal plating adding on the embedded metal traces 304(1), 304(2), as examples. The solder resist layer 314 may then be disposed over the metal interconnects 308(1), 308(2) to consume the metal interconnects 308(1), 308(2). The solder resist layer 314 is shown in FIG. 3 in a fabrication stage as being disposed over the metal interconnects 308(1), 308(2) before the solder resist layer 314 is polished or grinded down, to top metal interconnects surfaces 315(1), 315(2) of the metal interconnects 308(1), 308(2). The solder resist layer 314 is a thin layer of dielectric material, such as a polymer material, that is disposed over metal traces in the ETS metallization layer 302 to prevent oxidation of the embedded metal traces 304(1), 304(2) during fabrication of the package substrate 300. The solder resist layer 314 is patterned and etched to form openings above metal traces in the ETS metallization layer 302 to expose embedded metal traces 304(1), 304(2) for interconnection to die interconnects or other I/O interconnects. For example, the embedded metal traces 304(1), 304(2) could be coupled to I/O interconnects that extend to the sides of a die to another substrate in an IC package. The embedded metal traces 304(1), 304(2) could be coupled to die interconnects that extend from a die. The non-etched portions of the solder resist layer 314 remain resident in the IC package between the die and the package substrate 300 such that disposing the metal interconnects 308(1), 308(2) in the solder resist layer 314 does not contribute to an overall increase in the height of the package substrate 300 and the IC package in which the package substrate 300 is included in this example.

Figure 4:
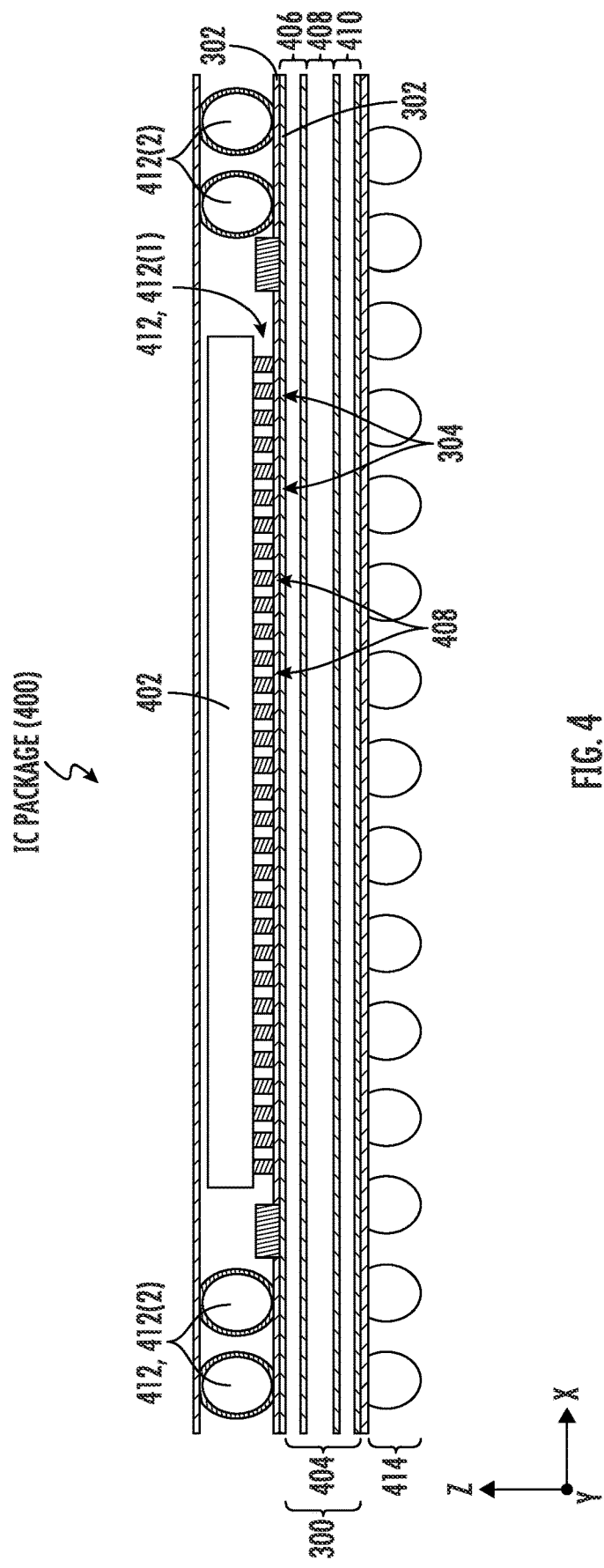
FIG. 4 is a side view of an exemplary IC package that includes a die mounted on a package substrate that includes ETS metallization layer with embedded metal traces, wherein added metal interconnects are provided and coupled to embedded metal traces of the ETS metallization layer, to reduce impedance of signal paths that include the embedded metal traces.

With continuing reference to FIG. 3, the ETS metal layer 310 has an ETS metal layer outer surface 316 and an ETS metal layer inner surface 318. In this example, the ETS metal layer outer surface 316 is disposed above the ETS metal layer inner surface 318 in the vertical direction (Z-axis direction). The embedded metal traces 304(1), 304(2) extend in a vertical direction (Z-axis direction) between the ETS metal layer outer surface 316 and the ETS metal layer inner surface 318. The ETS metal layer inner surface 318 will be adjacent to a metallization layer of a package substrate (for example, as shown in FIG. 4 discussed below) when the ETS metal layer 310 is disposed on a package substrate. In this example, the solder resist layer 314 is disposed adjacent to the ETS metal layer outer surface 316. The metal interconnects 308(1), 308(2) are disposed in the solder resist layer 314 adjacent to the ETS metal layer outer surface 316. The embedded metal traces 304(1), 304(2) each have a respective first, top embedded metal trace surface 320(1), 320(2) that are in contact with the metal interconnects 308(1), 308(2) in the solder resist layer 314. First, bottom metal interconnect surfaces 322(1), 322(2) of the metal interconnects 308(1), 308(2) extend to a solder resist layer inner surface 324 of the ETS metallization layer 302 and in contact with the first, top embedded metal trace surface 320(1), 320(2) of the embedded metal traces 304(1), 304(2). Second, bottom embedded metal trace surfaces 326(1), 326(2) of the embedded metal traces 304(1), 304(4) extend into the insulating layer 312 of the ETS metallization layer 302.

The ETS metallization layer 302 in FIG. 3 can be provided in a package substrate of an IC package to provide an electrical interface between a die and the package substrate. In this regard, FIG. 4 is a side view of an exemplary IC package 400 that includes a die 402 mounted on the package substrate 300. The ETS metallization layer 302 is disposed adjacent to and on a substrate 404 in the package substrate 300. In this example, the substrate 404 of the package substrate 300 includes the first, upper metallization layers 406 disposed on a core substrate 408. The core substrate 408 is disposed on additional second, bottom metallization layers 410. The first, upper metallization layers 406 provide an electrical interface for signal routing from the die 402, through the ETS metallization layer 302, to the core substrate 408. The die 402 is electrically coupled to the ETS metallization layer 302 through the interconnects 412 (e.g., raised interconnect bumps) coupled between an interconnect structure of the IC package 400 and embedded metal traces 304 in the ETS metallization layer 302. Note that the interconnects 412 could be die interconnects 412(1) (e.g., raised interconnect bumps) that are coupled to the die 402 or could be I/O interconnects 412(2) (e.g., interconnect bumps) in I/O signal paths in the IC package 400. In this example, as discussed above with regard to FIG. 3, the interconnects 412 are coupled to metal interconnects 308 in the solder resist layer 314, which are coupled to embedded metal traces 304 in the ETS metallization layer 302. This reduces impedance of signal paths between the die 402, through interconnects 412 and through the embedded metal traces 304 to the package substrate 300. The core substrate 408 also provides additional mechanical support for the IC package 400, and provides and electrical interface between the first, upper metallization layers 406 and the second, bottom metallization layers 410. External solder interconnects 414 are electrically coupled to the second, bottom metallization layers 410 to provide an external electrical interface to the IC package 400 and its die 402 through the package substrate 300.

Figure 5B:
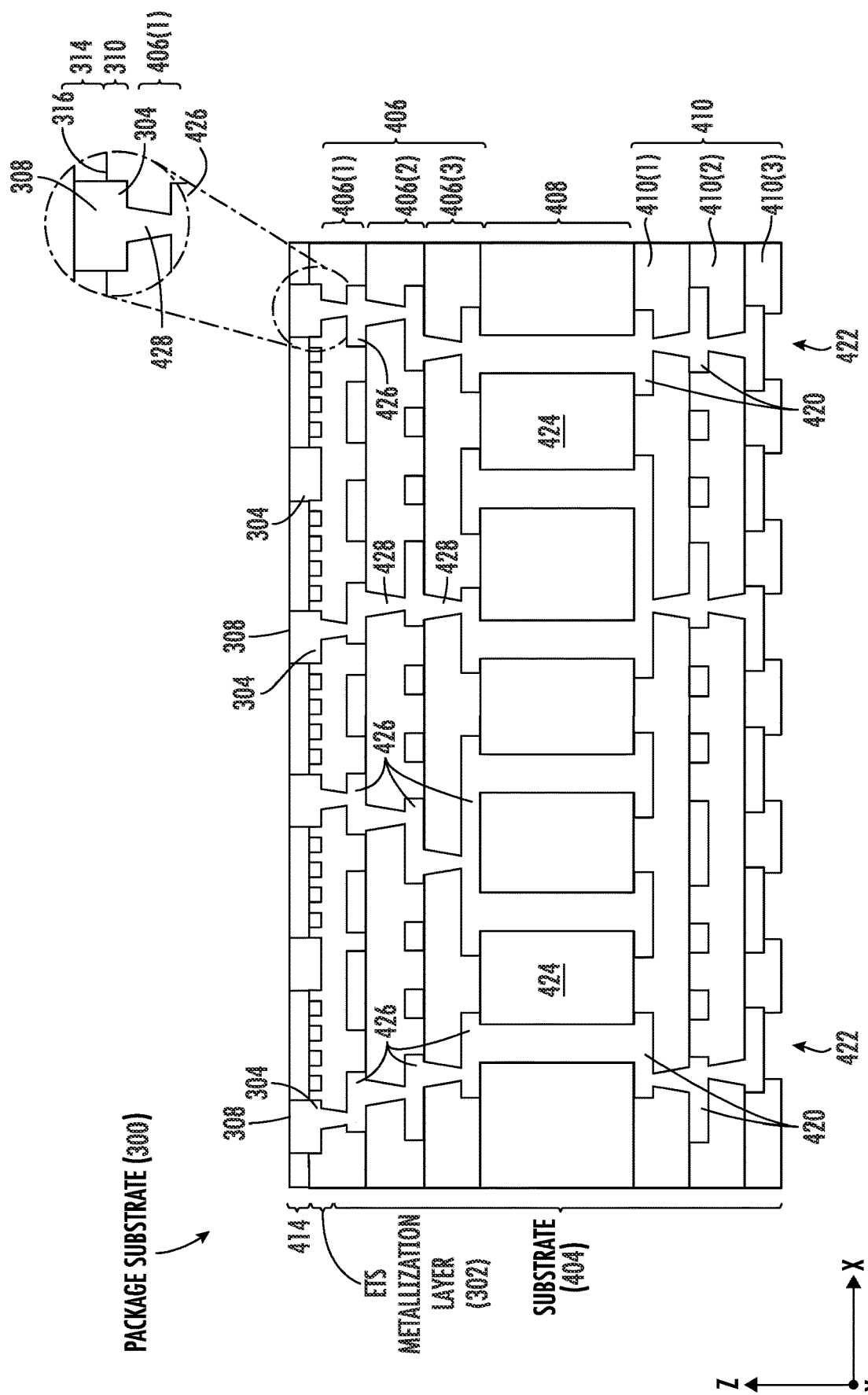
FIG. 5B is side view illustrating more detail of the package substrate in the IC package in FIG. 4, including the ETS metallization layer and added metal interconnects provided in a solder resist layer disposed on the ETS metallization layer.

To illustrate additional exemplary detail of the IC package 400 in FIG. 4 and its package substrate 300 that includes the ETS metallization layer 302 with embedded metal traces 304 coupled to metal interconnects 308 in the solder resist layer 314, FIGS. 5A and 5B are provided. FIG. 5A is a side view of an exemplary IC assembly 500 that includes the IC package 400 in FIG. 4. FIG. 5B is a more detailed side view of the package substrate 300 in the IC package 400 that illustrates more detail of the package substrate 300, the ETS metallization layer 302, and the metal interconnects 308 provided in the solder resist layer 314 and coupled to an embedded metal trace 304 in the ETS metallization layer 302.

As shown in FIG. 5A, the IC assembly 500 that includes the IC package 400 employing the package substrate 300 that includes the ETS metallization layer 302 on disposed adjacent and on the substrate 404. In this example, the substrate 404 is a cored substrate that includes a core substrate 408 discussed below, but the substrate 404 could also be provided as a coreless substrate. As will be discussed in more detail below, the package substrate 300 includes the ETS metallization layer 302 to facilitate providing higher density interconnects to provide bump/solder joints for coupling the die 402 to the package substrate 300. The ETS metallization layer 302 is a coreless structure that includes metal traces embedded in the dielectric material for signal routing. The ETS metallization layer 302 includes the embedded metal traces 304 that are coupled to interconnects 412 (e.g., bump/solder joints) for coupling the die 402 to the package substrate 300. Providing the embedded metal traces 304 for die connections in an ETS metallization layer 302 can facilitate the embedded metal traces 304 having a reduced line-spacing ratio (LS) (e.g., 5.0 micrometers (μm)/ 5.0 μm or less) over interconnects in a cored substrate. This can be useful for higher die interconnect density IC package applications to allow for a higher density of connection to be made between the die 402, via the interconnects 412, to the package substrate 300 through the embedded metal traces 304 in the ETS metallization layer 302. As also shown in FIG. 5A, metal interconnects 308 in the solder resist layer 314 are disposed adjacent to the ETS metal layer outer surface 316 of the ETS metallization layer 302 and coupled to an embedded metal trace 304. Interconnects 412 are coupled to the metal interconnects 308 to couple the die 402 to the ETS metallization layer 302 and the package substrate 300.

With continuing reference to FIG. 5A, the IC package 400 is mounted on a PCB 416 to form the IC assembly 500. To provide more rigidity to the package substrate 300 to reduce or avoid warpage, the package substrate 300 includes the core substrate 408. The external solder interconnects 414 (e.g., solder balls) are formed on a first, bottom surface 418 of the core substrate 408 disposed between the first and second metallization layers 406, 410. The core substrate 408 is a substrate that includes a core region that is typically thicker and is made from a dielectric material that is stiff to prevent or reduce warpage. The core substrate 408 is disposed below the first metallization layers 406 and the ETS metallization layer 302 in the Z-axis direction in FIG. 5A. The ETS metallization layer 302 is mounted on the first metallization layers 406.

Additional exemplary detail of the package substrate 300 in the IC package 400 in FIG. 5A is shown in a side view of the package substrate 300 in FIG. 5B. With reference to FIG. 5B, the substrate 404 includes the second metallization layers 410 that include second metallization layers 410(1)-410(3) below the core substrate 408 in the vertical direction (Z-axis direction). The second metallization layers 410(1)-410(3) each include one or more metal substrate interconnects 420 (e.g., e.g., metal traces, metal lines, metal post, metal pillars, vertical interconnect accesses (vias)) for providing electrical signal routing. The bottom metallization layer 410(3) includes openings 422 to form the solder interconnects 414 in FIG. 5A in connection with the metal substrate interconnects 420 in the bottom metallization layer 410(3). The substrate 404 also includes the core substrate 408 that includes metal pillars 424 to provide electrical signal routing through the core substrate 408. The metal pillars 424 are coupled to the metal substrate interconnects 420 in the second metallization layers 410(1)-410(3) to provide electrical signal routing from the external solder interconnects 414 in FIG. 5A to the core substrate 408. The substrate 404 also includes metallization layers 406(1)-406(3) disposed above the core substrate 408 in the vertical direction (Z-axis direction) in FIG. 5B that each include one or more substrate metal interconnects 426 to provide electrical signal muting through the metallization layers 406(1)-406(3). The substrate metal interconnects 426 are coupled to the metal pillars 424 in the core substrate 408 to provide electrical signal routing to the solder interconnects 414 shown in FIG. 5A.

With continuing reference to FIG. 5B, the package substrate 300 includes the ETS metallization layer 302 that includes the ETS metal layer 310 that is disposed adjacent to the first metallization layer 406(1) in the cored substrate 226 for forming embedded metal traces 304 to provide connections to the die 402 in FIG. 5A. The ETS metal layer 310 has an ETS metal layer outer surface 316 and includes the embedded metal traces 304 adjacent to the ETS metal layer outer surface 316. Metal pillar interconnects (e.g., vias) 428 extend through and are coupled to a respective embedded metal trace 304 of the ETS metallization layer 302 and a first substrate metal interconnect 426 in the metallization layer 238(1) of the cored substrate 226. The metal interconnects 308 in the solder resist layer 314 are disposed adjacent to the ETS metal layer outer surface 316 of the ETS metallization layer 302 and coupled to an embedded metal trace 304. Interconnects 412 are coupled to the metal interconnects 308 to couple the die 402 to the ETS metallization layer 302 and the package substrate 300.

Note with respect to FIGS. 5A and 5B, that the first, upper metallization layer 406(1) (or other metallization layers) in the metallization layers 406 can also serve as a bridge layer to provide die-to-die (D2D) connections between multiple dies (not shown). In this regard, in one example, first substrate metal interconnects 426 in the first, upper, metallization layer 406(1) that are coupled to the die 402 through a respective embedded metal trace 304 and coupled metal pillar interconnect 428 can be coupled to other first substrate metal interconnects 426 in the upper, first metallization layer 406(1) that are coupled to another die to provide a D2D connection between the die 402 and the other die. In this manner, the ETS metallization layer 302 with its embedded metal traces 304 provided at a smaller L/S can support higher density D2D connections between multiple dies. This may avoid having to expand a bridge for D2D connections into lower metallization layers in the substrate 404 that could otherwise be used for other signal routing.

FIGS. 6A and 6B are respective side views of the solder resist layer 314 that includes the metal interconnects 308(1), 308(2) as compared to an alternative solder resist layer 614 that does not include metal interconnects. FIG. 6A is a side view of the solder resist layer 314 disposed on the ETS metallization layer 302 that has the metal interconnects 308(1), 308(2) coupled to the embedded metal traces 304(1), 304(2), like in FIG. 3. FIG. 6B illustrates a side view of an alternative solder resist layer 614 disposed on the ETS metallization layer 302 that does not include metal interconnects 308(1), 308(2). The solder resist layer 614 in FIG. 6B is shown before openings are disposed therein to provide interconnections to the embedded metal traces 304(1), 304(2). As shown in FIG. 6B, in this example, the overall height $H_4$ of the ETS metal layer 310 and the solder resist layer 614 is less than the overall height $H_1$ of the ETS metal layer 310 and the solder resist layer 314 in FIG. 6A. Thus, in this example, providing the metal interconnects 308(1), 308(2) in the solder resist layer 314 in FIG. 3B may contribute to additional overall height in the vertical direction (Z-axis direction) of an IC package. However, this additional height comes at the benefit of reduced impedance of the signal paths that include the embedded metal traces 304(1), 304(2) in FIG. 6A, as compared to the embedded metal traces 304(1), 304(2) in FIG. 6B.

As discussed above, the metal interconnects were added in a solder resist layer disposed on an ETS metallization layer to reduce the impedance of signal paths that include embedded metal traces in the ETS metallization layer. Alternatively, the metal interconnects could be coupled to embedded metal traces in an ETS metallization layer below the embedded metal traces in a vertical direction. In this scenario, as an example, the metal interconnects could be added in an insulating layer in the ETS metallization layer adjacent to its ETS metal layer where there embedded metal traces are formed, and in addition or in place of vertical interconnect accesses (vias) coupling the embedded metal traces to metal interconnects in an adjacent, underlying metallization layer. In this instance, these vias could be expanded in cross-sectional area to increase the metal surface area of the embedded metal traces.

In this regard, FIG. 7 is a side view of a portion of an alternative package substrate 700 that includes added metal 703(1), 703(2) in the form of metal interconnects 708(1), 708(2) disposed in an insulating layer 712 of an ETS metallization layer 702 adjacent to an ETS metal layer 710 of the ETS metallization layer 702. The ETS metallization layer 702 is a metallization layer of the package substrate 700. The ETS metal layer 710 is a metal layer in the ETS metallization layer 702. The ETS metal layer 710 is disposed adjacent to the insulating layer 712 in the ETS metallization layer 702. In this example, the metal interconnects 708(1), 708(2) are disposed in the insulating layer 712 of the ETS metallization layer 702 below the ETS metal layer 710 in a vertical direction (Z-axis direction). The metal interconnects 708(1), 708(2) are coupled to the respective embedded metal traces 704(1), 704(2) embedded in the ETS metal layer 710 to reduce the impedance of signal paths that include the embedded metal traces 704(1), 704(2).

With reference to FIG. 7, the embedded metal traces 704(1), 704(2) can be metal traces, metal lines, metal post, metal pillars, vertical interconnect accesses (vias), as examples. The discussion and exemplary details regarding the embedded metal traces 304, 304(1), 304(2) in FIGS. 3-5B are also applicable to the embedded metal traces 704(1), 704(2) in FIG. 7. The metal interconnects 708(1), 708(2) are formed from a metal material (such as copper) and are provided and disposed in contact with the embedded metal traces 704(1), 704(2) disposed in an ETS metal layer 710 of an ETS metallization layer 702 coupled to a substrate 705. The metal interconnects 708(1), 708(2) can be provided in the form of metal traces, metal lines, metal blocks, etc. The metal interconnects 708(1), 708(2) reduce impedance of signal paths that include the embedded metal traces 704(1), 704(2) as compared to if the metal interconnects 708(1), 708(2) were not provided. The impedance of the embedded metal traces 704(1), 704(2) is reduced, because providing the metal interconnects 708(1), 708(2) increases the metal surface area of the embedded metal traces 704(1), 704(2), which in turn increases the capacitance of the embedded metal traces 704(1), 704(4). Impedance is inversely proportional to capacitance. The capacitance of the embedded metal traces 704(1), 704(4) is increased by the metal interconnects 708(1), 708(2), increasing the metal surface area of the embedded metal traces 704(1), 704(2), because capacitance of the embedded metal traces 304(1), 304(2) is proportional to the surface area 'A' of the metal of the combined embedded metal traces 704(1), 704(2) and metal interconnects 708(1), 708(2). The capacitance 'C' of the combined embedded metal traces 704(1), 704(4) and metal interconnects 708(1), 708(2) is $C = \varepsilon A / d_1$, where 'A' is the metal surface area, and '$d_2$' is the distance between the embedded metal traces 704(1), 704(2) as shown in FIG. 3.

Note that the capacitance of the embedded metal traces 704(1), 704(2) could also be increased by reducing the distance $d_2$ (spacing S) between the embedded metal traces 704(1), 704(2), because the embedded metal traces 704(1), 704(2) act as a parallel plate capacitor. However, reducing the distance $d_2$ between the embedded metal traces 704(1), 704(2) may not be desired, because the distance $d_2$ is controlled by the fabrication processes and technology used to fabricate the package substrate 700. Fabrication processes are subject to limitations that control a minimum distance or pitch according to the minimum line/spacing ratio (L/S) (e.g., 5.0 micrometers (μm)/5.0 μm) between adjacent metal lines, such as embedded metal traces 704(1), 704(2). These distance $d_2$ limitations between the embedded metal traces 704(1), 704(2) are also a function of placement and alignment tolerances of the fabrication process, to avoid short circuits between the embedded metal traces 704(1), 704(2).

Also, in the example package substrate 700 and ETS metallization layer 702 in FIG. 7, the metal interconnects 708(1), 708(2) are disposed below the embedded metal traces 704(1), 704(1) in the ETS metal layer 710 in a vertical direction (Z-axis direction) of the package substrate 700. This is opposed to increasing the width of the embedded metal traces 704(1), 704(2) in the horizontal directions (X- and/or Y-axes directions) in the ETS metallization layer 702. Increasing the width of the embedded metal traces 704(1), 704(2) in the horizontal directions (X- and/or Y-axes directions) in the ETS metallization layer 702 may increase the overall width of the package substrate 700, resulting in an increased IC package width in an undesired manner. By disposing the metal interconnects 708(1), 708(2) adjacent to the embedded metal traces 704(1), 704(2) in the vertical direction (Z-axis direction) in this example, an increase in width of the ETS metallization layer 702 and package substrate 700 may be avoided. However, disposing the metal interconnects 708(1), 708(2) adjacent to the embedded metal traces 704(1), 704(2) in the vertical direction (Z-axis direction) could increase the height of the package substrate 700, and thus the overall height of the IC package including the package substrate 700. For example, as shown in FIG. 7, the overall height $H_6$ of the metal interconnects 708(1), 708(2) disposed below the embedded metal traces 704(1), 704(2) is a combination of the individual respective heights $H_2$, $H_7$ of the embedded metal traces 704(1), 704(2) with the metal interconnects 708(1), 708(2) disposed therein.

In this example, to avoid or mitigate an increase in the overall height of the package substrate and the IC package in which the package substrate 700 is provided, the metal interconnects 308(1), 308(2) are disposed in an insulating layer 712 of the ETS metallization layer 702, outside of the ETS metal layer 710. The metal interconnects 308(1), 308 (2) can be formed in patterned openings in the insulating layer 712 adjacent to the embedded metal traces 304(1), 304(2) as separate metal interconnects or metal plating adding on the embedded metal traces 304(1), 304(2), as examples. In this manner, because an insulating layer is already provided conventionally in an ETS metallization layer, disposing the metal interconnects 308(1), 308(2) in the insulating layer will have a minimal impact on increasing the overall height overall height $H_6$ of the metal interconnects 708(1), 708(2) disposed below the embedded metal traces 704(1), 704(2) and, thus the height of the package substrate 700 and the IC package it is incorporated in. In this example, as shown in FIG. 7, the metal interconnects 708(1), 708(2) are electrically coupled to respective metal pillar interconnects 728(1), 728(2) (e.g., vias) in a first metallization layer 706(1) that are coupled to respective first substrate metal interconnects 726(1), 726(2). The ETS metallization layer 702 with its embedded metal traces 704(1), 704(2) and metal interconnects 708(1), 708(2) in its insulating layer 712 and coupled to the embedded metal traces 704(1), 704(2) can be provided in the package substrate 300 in FIGS. 3-5B. For example, if the ETS metallization layer 702 were provided as in the package substrate 300 in FIG. 5B, the metal pillar interconnects 728(1), 728(2) could be the metal pillar interconnects 428 provided in the first metallization layer 406(1) and coupled to respective first substrate metal interconnects 426.

With continuing reference to FIG. 7, the ETS metal layer 710 has an ETS metal layer outer surface 716 and an ETS metal layer inner surface 718. In this example, the ETS metal layer outer surface 716 is disposed above the ETS metal layer inner surface 718 in the vertical direction (Z-axis direction). The embedded metal traces 704(1), 704(2) extend in a vertical direction (Z-axis direction) between the ETS metal layer outer surface 716 and the ETS metal layer inner surface 718. The insulating layer 712 is disposed adjacent to the ETS metal layer inner surface 718 of the ETS metal layer 710. The insulating layer 712 is adjacent to the first metallization layer 706(1) of the substrate 705 when the ETS metallization layer 702 is disposed on the substrate 705. The embedded metal traces 704(1), 704(2) each have a respective first, top embedded metal trace surface 720(1), 720(2) that will be coupled to metal interconnects in an IC package. First, top metal interconnects surfaces 722(1), 722(2) of the metal interconnects 708(1), 708(2) extend to the ETS metal layer inner surface 718 of the ETS metal layer 710 and in contact with second, bottom embedded metal trace surfaces 727(1), 727(2) of the embedded metal traces 704(1), 704(2). Second, bottom metal interconnect surfaces 730(1), 730(2) of the metal interconnects 708(1), 708(2) are coupled to first, top surfaces 732(1), 732(2) of the metal pillar interconnects 728(1), 728(2).

Figure 8:
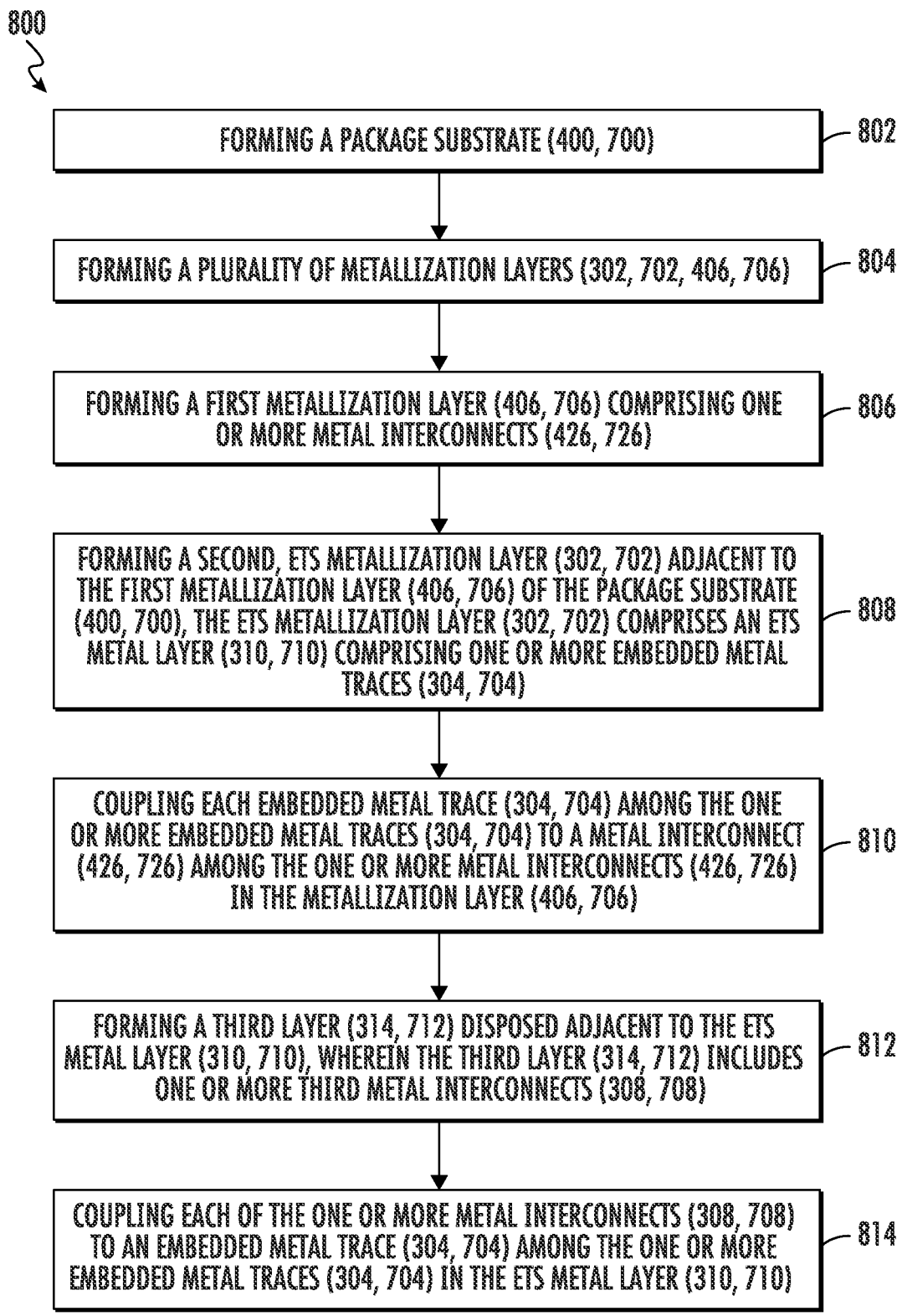
FIG. 8 is a flowchart illustrating an exemplary fabrication process of fabricating the IC package that includes an ETS metallization layer formed in a package substrate, wherein interconnects are provided and coupled to embedded metal traces of the ETS metallization layer to reduce impedance of signal paths that include the embedded metal traces, including but not limited to the IC packages and related structures in FIGS. 3-5B and 7.

The substrate 404, 705 and their ETS metallization layers 302, 702 having embedded metal traces 304, 704 coupled to metal interconnects 308, 708 to reduce impedance of signal paths that include the embedded metal traces 304, 704 can be fabricated in different fabrication processes. In this regard, FIG. 8 is a flowchart illustrating an exemplary fabrication process 800 of fabricating an IC package that includes a package substrate that includes an ETS metallization layer formed in a package substrate. Metal interconnects are also provided and coupled to embedded metal traces of the ETS metallization layer to reduce impedance of signal paths that include the embedded metal traces. The fabrication process 800 in FIG. 8 can be used to fabricate the package substrates 300, 700 in FIGS. 3-5B and 7, as an example. The fabrication process 800 in FIG. 8 will be discussed in conjunction with the package substrates 300, 700 in FIGS. 3-5B and 7 as an example. Note that ETS metallization layer 702 with its embedded metal traces 704(1), 704(2) and metal interconnects 708(1), 708(2) in its insulating layer 712 and coupled to the embedded metal traces 704(1), 704(2) can be provided in the package substrate 700 in FIGS. 3-5B.

In this regard, a first step in the fabrication process 800 can include forming a package substrate 400, 700 (block 802 in FIG. 8). Forming the package substrate 400, 700 includes forming a plurality of metallization layers 302, 702, 406, 706 (block 804 in FIG. 8). Forming the plurality of metallization layers 302, 702, 406, 706 includes forming a first metallization layer 406, 706 comprising one or more metal interconnects 426, 726 (block 806 in FIG. 8). Forming the plurality of metallization layers 302, 702, 406, 706 also includes forming a second, ETS metallization layer 302, 702 adjacent to the first metallization layer 406, 706 of the package substrate 400, 700 (block 808 in FIG. 8). The ETS metallization layer 302, 702 comprises an ETS metal layer 310, 710 comprising one or more embedded metal traces 304, 704 (block 808 in FIG. 8). A next step the fabrication process 800 can include coupling each embedded metal trace 304, 704 among the one or more embedded metal traces 304, 704 to a metal interconnect 426, 726 among the one or more metal interconnects 426, 726 in the metallization layer 406, 706 (block 810 in FIG. 8). A next step the fabrication process 800 can include forming a third layer 314, 712 disposed adjacent to the ETS metal layer 310, 710, wherein the third layer 314, 712 includes one or more third metal interconnects 308, 708 (block 812 in FIG. 8). A next step the fabrication process 800 can include coupling each of the one or more metal interconnects 308, 708 to an embedded metal trace 304, 704 among the one or more embedded metal traces 304, 704 in the ETS metal layer 310, 710 (block 814 in FIG. 8).

Figure 9A:
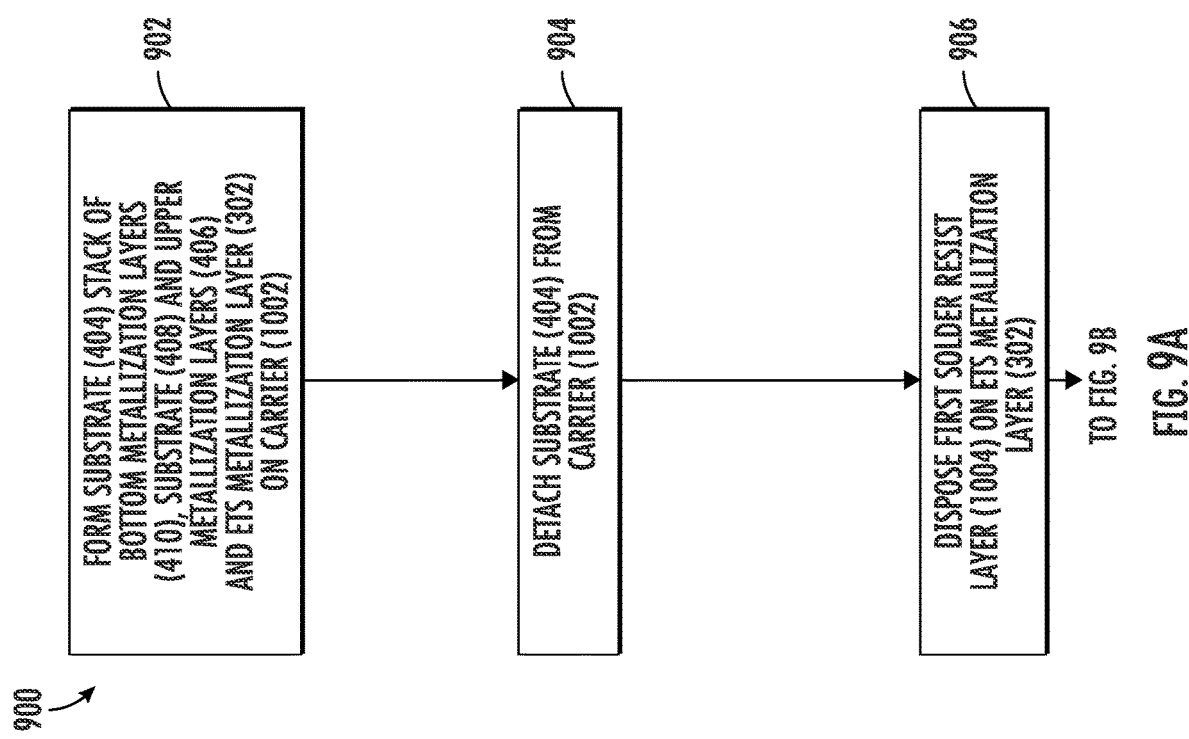
Figure 10G:
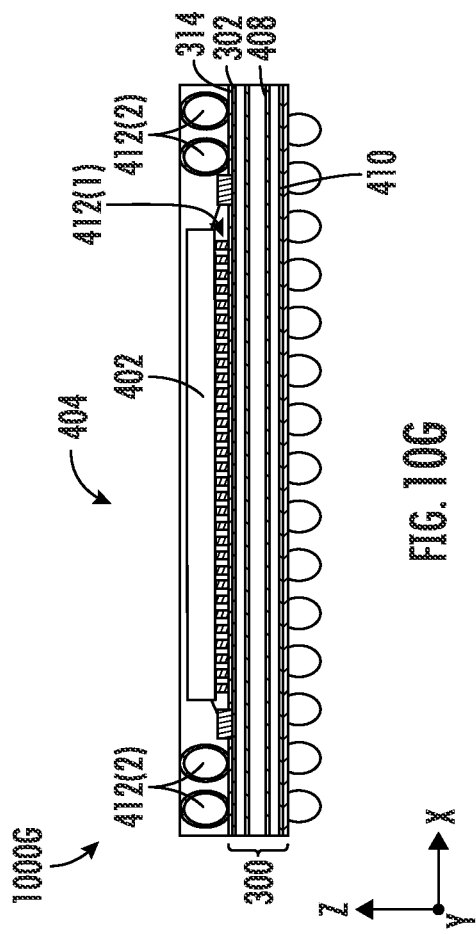
Figure 9C:
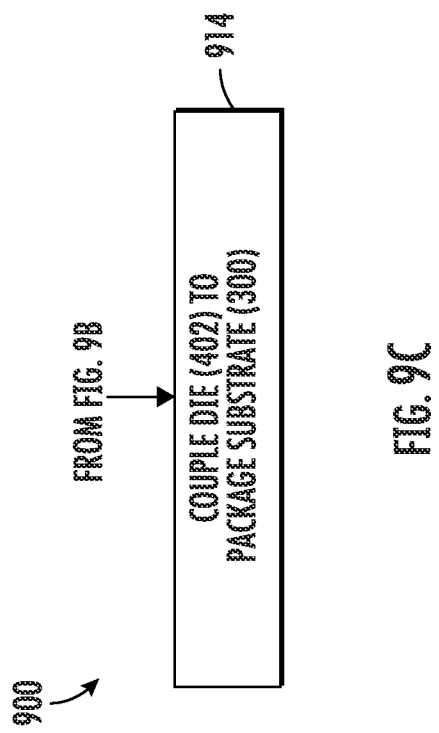

Other fabrication processes can also be employed to fabricate package substrates and their ETS metallization layers having embedded metal traces coupled to metal interconnects to reduce impedance of signal paths, including but not limited to the package substrates 300 and 700 in FIGS. 3-B and 7, respectively. In this regard, FIGS. 9A-9C is a flowchart illustrating another exemplary fabrication process 900 of fabricating an IC package that includes a package substrate that includes an ETS metallization layer formed in a package substrate, wherein metal interconnects are provided and coupled to embedded metal traces of the ETS metallization layer to reduce impedance of signal paths that include the embedded metal traces. FIGS. 10A-10G are exemplary fabrication stages 1000A-1000G during fabrication of an IC package and its package substrate according to the fabrication process 900 in FIGS. 9A-9C. The fabrication process 900 as shown in the fabrication stages 1000A-1000G in FIGS. 10A-10G are in reference to the package substrate 300 in FIGS. 3-5B, and thus will be discussed with reference to the package substrate 300 in FIGS. 3-5B.

Figure 10A:
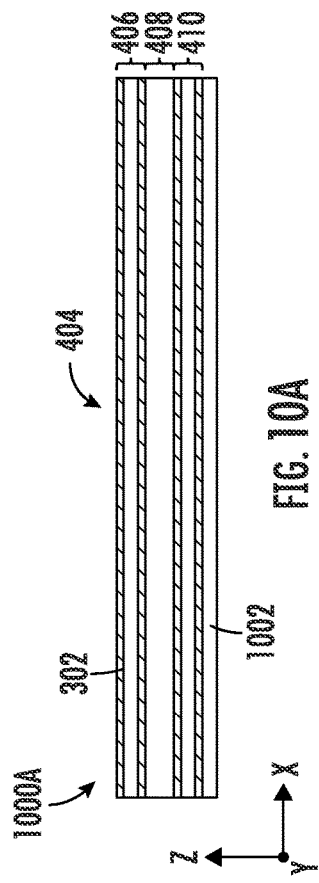
Figure 10B:
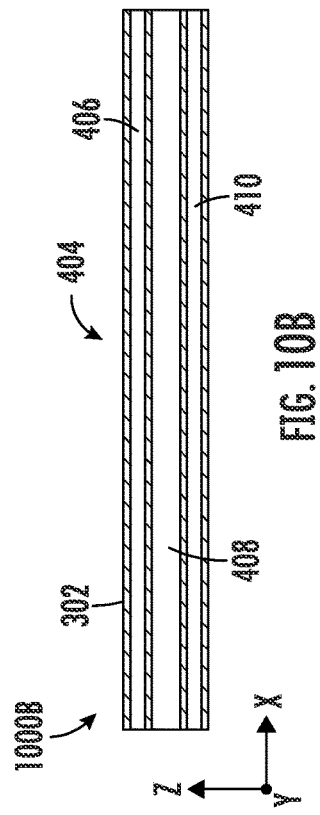
Figure 10C:
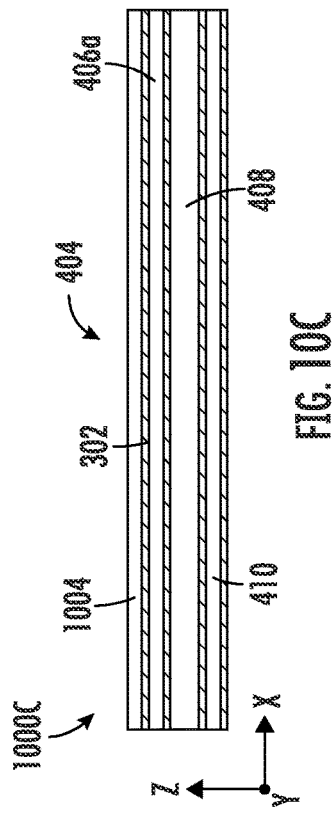

In this regard, as shown the fabrication stage 1000A in FIG. 10A, a first exemplary step in the fabrication process 900 is forming the substrate 404 that includes a build-up process to form a second, bottom metallization layer 410 on a carrier 1002, from the core substrate 408 on the second, bottom metallization layer 410, and to form the first, upper metallization layer 406 on the core substrate 408 (block 902 in FIG. 9A). The ETS metallization layer 302 is disposed on the on the first, upper metallization layers 406 (block 902 in FIG. 9A). As shown the fabrication stage 1000B in FIG. 10B, a next exemplary step in the fabrication process 900 is removing the substrate 404 from the carrier 1002 (block 904 in FIG. 9B). As shown the fabrication stage 1000C in FIG. 10C, a next exemplary step in the fabrication process 900 is disposing a first solder resist layer 1004 on the ETS metallization layer 302 (block 906 in FIG. 9B).

As shown the fabrication stage 1000D in FIG. 10D, a next exemplary step in the fabrication process 900 is disposing a photoresist layer on the first solder resist layer 1004 and patterning the photoresist layer to form openings 1006(1), 1006(2), 1006(3) on the first solder resist layer 1004. Openings 1006(1) are formed in the first solder resist layer 1004 for die interconnects of a die. Openings 1006(2) are formed in the first solder resist layer 1004 for I/O interconnects to be coupled to embedded metal traces 304 in the ETS metallization layer 302 to be coupled to the package substrate 300. Openings 1006(3) are formed in the first solder resist layer 1004 to form the metal interconnects 308 (block 908 in FIG. 9D). As shown the fabrication stage 1000E in FIG. 10E, a next exemplary step in the fabrication process 900 is forming the metal interconnects 308 in the openings 1006(3) in the first solder resist layer 1004 in contact with embedded metal traces 304 below in the ETS metallization layer 302 (block 910 in FIG. 9B). The metal interconnects 308 are formed in openings 1006(1), 1006(2) where it is desired to provide metal interconnects 308 to be coupled to embedded metal traces 304 in the ETS metallization layer 302. For example, it may only be desired to form the metal interconnects 308 in the openings 1006(2) that are in areas to be coupled to I/O interconnects, but the metal interconnects 308 could also be provided in openings 1006(1) to be coupled to die interconnects.

As shown the fabrication stage 1000F in FIG. 10F, a next exemplary step in the fabrication process 900 is disposing a second solder resist layer 1008 over the first solder resist layer 1004 and the metal interconnects 308 (block 912 in FIG. 9B). A photoresist layer is disposed over the second solder resist layer 1008 and the solder resist layer 1008 is patterned to form openings 1010 in the second solder resist layer 1008 where it is desired to provide electrical interconnections to the substrate 404 (block 912 in FIG. 9B). The first and second solder resist layers 1004, 1008 can form the solder resist layer 314 discussed above and illustrated in FIGS. 3-5B in which the metal interconnects 308 are formed. As shown the fabrication stage 1000G in FIG. 10G, a next exemplary step in the fabrication process 900 is coupling the die 402 to the package substrate 300 with die interconnects 412(1) coupled to embedded metal traces 304 in the ETS metallization layer 302, and I/O interconnects 412(2) also coupled to embedded metal traces 304 in the ETS metallization layer 302 (block 914 in FIG. 9C). Metal interconnects 308 can be disposed in the solder resist layer 314 for any of the embedded metal traces 304 coupled to die interconnects 412(1) and I/O interconnects 412(2), if desired.

Figure 11:
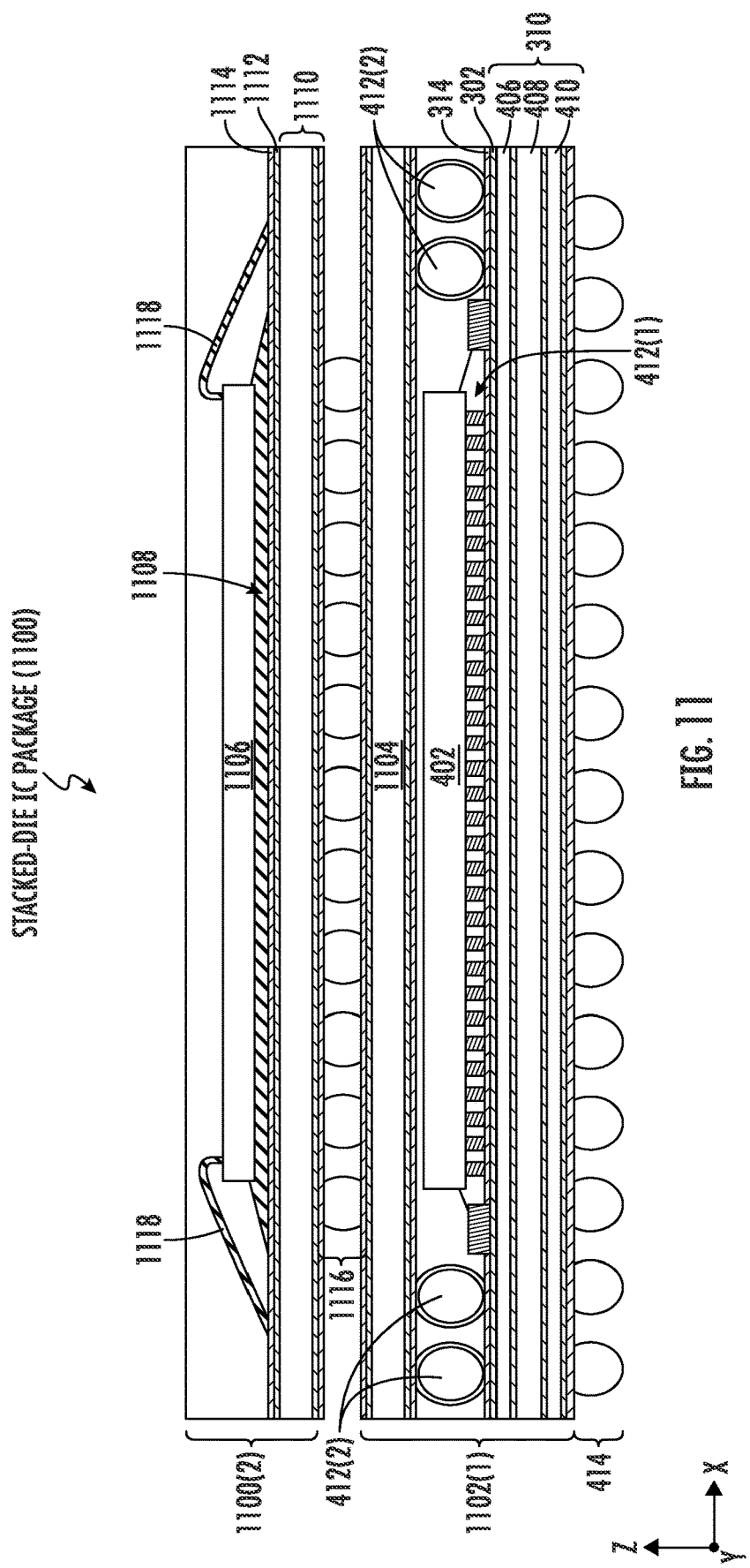
FIG. 11 is a side view of an exemplary stacked-die IC package that includes die packages that can each include an ETS metallization layer with interconnects provided and coupled to embedded metal traces of the ETS metallization layer to reduce impedance of signal paths that include the embedded metal traces.

Package substrates that include an ETS metallization layer that includes embedded metal traces with metal interconnects coupled thereto to reduce signal path inductance can also be provided in a multi-stacked IC die package. In this regard, FIG. 11 is a side view of an exemplary stacked-die IC package 1100 that includes die packages 1102(1), 1102(2) stacked on top of each other. In FIG. 11, the die package 1102(1) is the IC package 400 in FIG. 4. The die packages 1102(1), 1102(2) are electrically coupled to each other through an interposer 1104. The die package 1102(1) includes a die 1106 that is coupled through die interconnects 1108 to a package substrate 1110. The package substrate 1110 can include and ETS metallization layer 1112 like the ETS metallization layer 302. A solder resist layer 1114 is disposed on and between the ETS metallization layer 1112 and the die interconnects 1108 coupling the die 1106 to the package substrate 1110. The solder resist layer 1114 can include metal structure additions, like the metal structure additions 308 in the solder resist layer 314 in the package substrate 300. The interposer 1104 is coupled to the die package 1102(2) through external solder interconnects 1116. The interposer 1104 is also coupled to the die package 1102(1) through the I/O interconnects 412(2) in this example to provide for D2D communications between the dies 402, 1106. Wire bonds 1118 may also be provided to couple the die 1106 to the interposer 1104.

IC packages that include a die(s) mounted on a package substrate that includes an ETS metallization layer with embedded metal traces coupled to the die and the package substrate to provide an electrical interface between the die and the package substrate, wherein metal additions are provided and coupled to embedded metal traces of the ETS metallization layer to reduce impedance of signal paths, including, but not limited, to the IC packages FIGS. 3-5B and 7, and 10A-11, and according to the exemplary fabrication processes in FIGS. 8-9C, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 12:
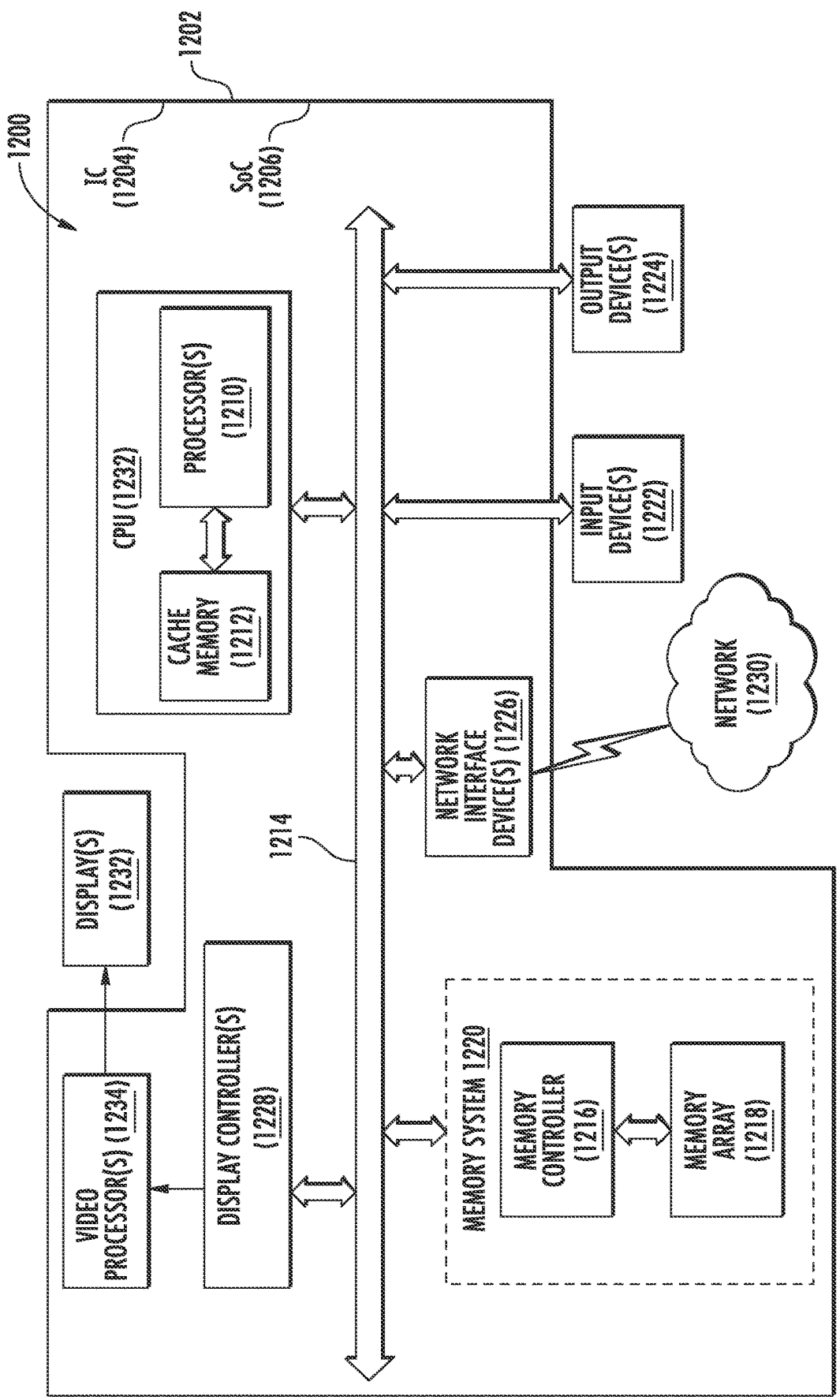
FIG. 12 is a block diagram of an exemplary processor-based system that can include components that can include an IC package that includes a die(s) mounted on a package substrate that includes an ETS metallization layer with embedded metal traces coupled to the die and the package substrate to provide an electrical interface between the die and the package substrate, wherein interconnects are provided and coupled to embedded metal traces of the ETS metallization layer to reduce impedance of signal paths, including, but not limited, to the IC packages FIGS. 3-5B and 7, and 10A-11, and according to the exemplary fabrication processes in FIGS. 8-9C.

In this regard, FIG. 12 illustrates an example of a processor-based system 1200 including a circuit that can be provided in an IC package 1202 that includes a die(s) mounted on a package substrate that includes an ETS metallization layer with embedded metal traces coupled to the die and the package substrate to provide an electrical interface between the die and the package substrate, wherein metal additions are provided and coupled to embedded metal traces of the ETS metallization layer to reduce impedance of signal paths, including, but not limited, to the IC packages FIGS. 3-5B, 7, and 10A-11, and according to the exemplary fabrication processes in FIGS. 8-9C, and according to any aspects disclosed herein. In this example, the processor-based system 1200 may be formed as an IC 1204 in an IC package 1202 and as a system-on-a-chip (SoC) 1206. The processor-based system 1200 includes a central processing unit (CPU) 1208 that includes one or more processors 1210, which may also be referred to as CPU cores or processor cores. The CPU 1208 may have cache memory 1212 coupled to the CPU 1208 for rapid access to temporarily stored data. The CPU 1208 is coupled to a system bus 1214 and can intercouple master and slave devices included in the processor-based system 1200. As is well known, the CPU 1208 communicates with these other devices by exchanging address, control, and data information over the system bus 1214. For example, the CPU 1208 can communicate bus transaction requests to a memory controller 1216, as an example of a slave device. Although not illustrated in FIG. 12, multiple system buses 1214 could be provided, wherein each system bus 1214 constitutes a different fabric.

Other master and slave devices can be connected to the system bus 1214. As illustrated in FIG. 12, these devices can include a memory system 1220 that includes the memory controller 1216 and a memory array(s) 1218, one or more input devices 1222, one or more output devices 1224, one or more network interface devices 1226, and one or more display controllers 1228, as examples. Each of the memory system 1220, the one or more input devices 1222, the one or more output devices 1224, the one or more network interface devices 1226, and the one or more display controllers 1228 can be provided in the same or different IC packages 1202. The input device(s) 1222 can include any type of input device, including, but not limited to, input keys, switches, voice processors, etc. The output device(s) 1224 can include any type of output device, including, but not limited to, audio, video, other visual indicators, etc. The network interface device(s) 1226 can be any device configured to allow exchange of data to and from a network 1230. The network 1230 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1226 can be configured to support any type of communications protocol desired.

The CPU 1208 may also be configured to access the display controller(s) 1228 over the system bus 1214 to control information sent to one or more displays 1232. The display controller(s) 1228 sends information to the display(s) 1232 to be displayed via one or more video processors 1234, which process the information to be displayed into a format suitable for the display(s) 1232. The display controller(s) 1228 and video processor(s) 1234 can be included as ICs in the same or different IC packages 1202, and in the same or different IC package 1202 containing the CPU 1208, as an example. The display(s) 1232 can include any type of display, including, but not limited to, a cathode ray tube (CRT), a liquid crystal display (LCD), a plasma display, a light emitting diode (LED) display, etc.

Figure 13:
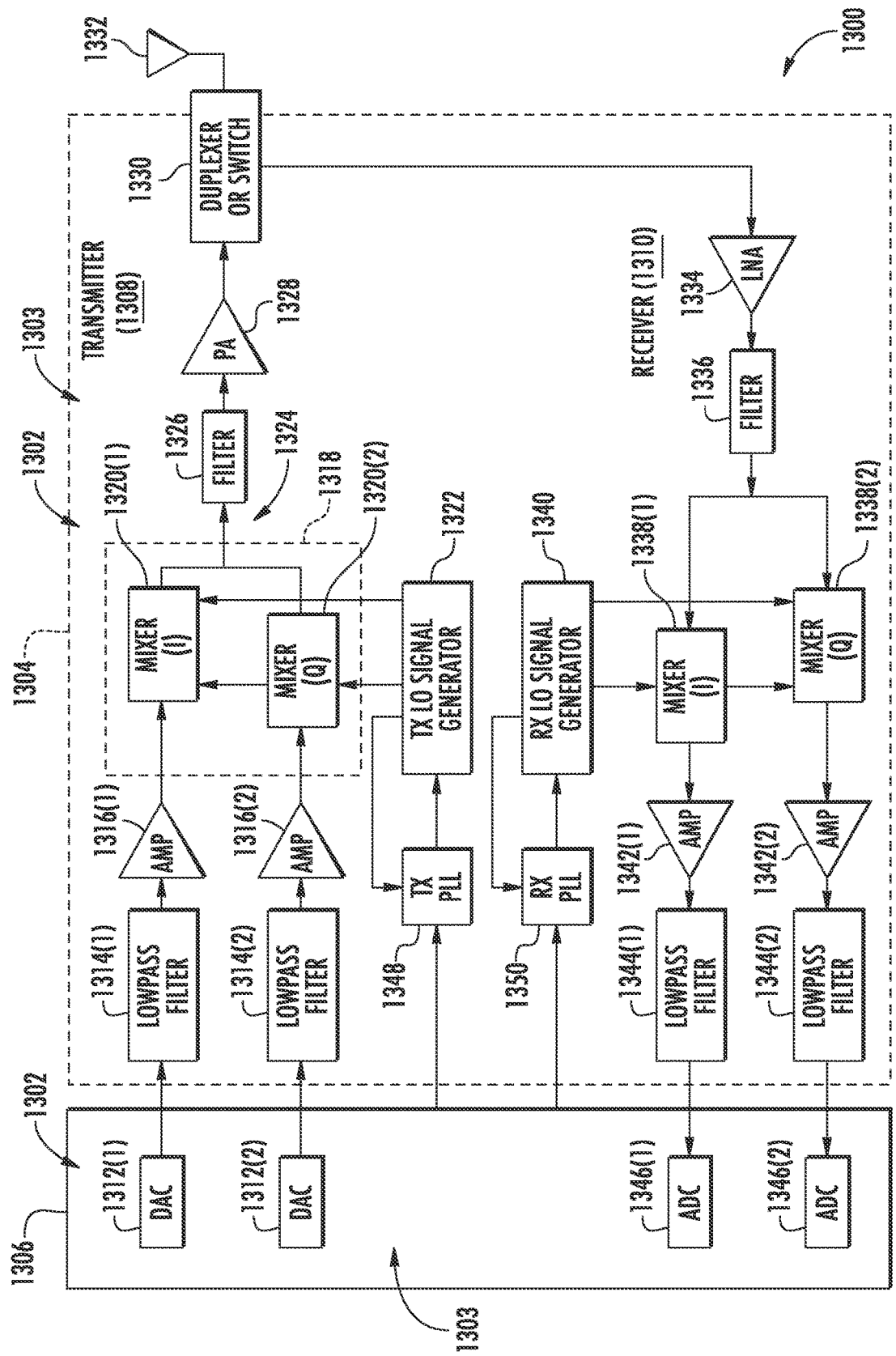
FIG. 13 is a block diagram of an exemplary wireless communications device that includes radio-frequency (RF) components that can include an IC package that includes a die(s) mounted on a package substrate that includes an ETS metallization layer with embedded metal traces coupled to the die and the package substrate to provide an electrical interface between the die and the package substrate, wherein interconnects are provided and coupled to embedded metal traces of the ETS metallization layer to reduce impedance of signal paths, including, but not limited, to the IC packages FIGS. 3-5B and 7, and 10A-11, and according to the exemplary fabrication processes in FIGS. 8-9C.

FIG. 13 illustrates an exemplary wireless communications device 1300 that includes radio frequency (RF) components formed from one or more ICs 1302, wherein any of the ICs 1302 can be included in an IC package 1303 that includes a die(s) mounted on a package substrate that includes an ETS metallization layer with embedded metal traces coupled to the die and the package substrate to provide an electrical interface between the die and the package substrate, wherein added metal interconnects are provided and coupled to embedded metal traces of the ETS metallization layer to reduce impedance of signal paths, including, but not limited, to the IC packages FIGS. 3-5B, 7, and 10A-11, and according to the exemplary fabrication processes in FIGS. 8-9C, and according to any aspects disclosed herein. The wireless communications device 1300 may include or be provided in any of the above-referenced devices, as examples. As shown in FIG. 13, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RF ICs (RFICs), mixed-signal ICs, etc.

The transmitter 1308 or the receiver 1310 may be implemented with a super heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1310. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312

(2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMPs) 1316(1), 1316(2) amplify the signals from the lowpass filters 1314(1), 1314(2), respectively, and provide I and Q baseband signals. An upconverter 1318 upconverts the I and Q baseband signals with I and Q transmit (TX) local oscillator (LO) signals through mixers 1320(1), 1320(2) from a TX LO signal generator 1322 to provide an upconverted signal 1324. A filter 1326 filters the upconverted signal 1324 to remove undesired signals caused by the frequency up-conversion as well as noise in a receive frequency band. A power amplifier (PA) 1328 amplifies the upconverted signal 1324 from the filter 1326 to obtain the desired output power level and provides a transmit RF signal. The transmit RF signal is routed through a duplexer or switch 1330 and transmitted via an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 1330 is designed to operate with a specific receive (RX)-to-TX duplexer frequency separation, such that RX signals are isolated from TX signals. The received RF signal is amplified by the LNA 1334 and filtered by a filter 1336 to obtain a desired RF input signal. Down-conversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by AMPs 1342(1), 1342(2) and further filtered by lowpass filters 1344(1), 1344(2) to obtain I and Q analog input signals, which are provided to the data processor 1306. In this example, the data processor 1306 includes analog-to-digital converters (ADCs) 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency up-conversion, while the RX LO signal generator 1340 generates the I and Q RX LO signals used for frequency down-conversion. Each LO signal is a periodic signal with a particular fundamental frequency. A TX phase-locked loop (PLL) circuit 1348 receives timing information from the data processor 1306 and generates a control signal used to adjust the frequency and/or phase of the TX LO signals from the TX LO signal generator 1322. Similarly, an RX PLL circuit 1350 receives timing information from the data processor 1306 and generates a control signal used to adjust the frequency and/or phase of the RX LO signals from the RX LO signal generator 1340.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered aspects/clauses:

1. An integrated circuit (IC) package, comprising:
    a package substrate, comprising:
        a plurality of metallization layers comprising:
            a first metallization layer comprising one or more first metal interconnects; and
            a second metallization layer comprising:
                a second metal layer, and
                one or more metal traces embedded in the second metal layer; and
            a third layer disposed adjacent to the second metal layer, the third layer
                comprising one or more third metal interconnects each coupled to
                a metal trace among the one or more metal traces.
2. The IC package according to clause 1, wherein:
    the second metal layer comprises a metal layer outer surface;
    the third layer comprises a solder resist layer disposed adjacent to the metal layer outer surface; and
    the one or more third metal interconnects are each disposed in the solder resist layer and adjacent to the metal layer outer surface.
3. The IC package according to clause 2, wherein:
    the one or more metal traces each comprise a first metal trace surface exposed from the metal layer outer surface; and
    the one or more third metal interconnects in the solder resist layer are each disposed in contact with the first metal trace surface of the metal trace among the one or more metal traces.
4. The IC package according to clause 1, wherein:
    the second metal layer comprises a metal layer outer surface and a metal layer inner surface;
    each of the one or metal traces extend in a vertical direction in the second metal layer to the metal layer outer surface and the metal layer inner surface;
    the second metallization layer further comprises an insulating layer disposed adjacent to the metal layer inner surface of the second metal layer, and
    the one or more third metal interconnects are disposed in the insulating layer.
5. The IC package according to clause 4, wherein:
    the one or more metal traces each comprise a second metal trace surface exposed from the metal layer inner surface; and
    the one or more third metal interconnects in the insulating layer are each disposed in contact with the second metal trace surface of the metal trace among the one or more metal traces.
6. The IC package according to any of clauses 1-5, wherein each metal trace among the one or more metal traces is coupled to a first metal interconnect among the one or more of first metal interconnects.
7. The IC package according to any of clauses 1-6, wherein the second metallization layer is disposed adjacent to the first metallization layer.
8. The IC package according to any of clauses 1-7, wherein the package substrate further comprises a core substrate comprising one or more core metal interconnects each coupled to a first metal interconnect among the one or more of first metal interconnects.
9. The IC package according to any of clauses 1-7, wherein the package substrate further comprises comprising a coreless substrate.
10. The IC package according to any of clauses 1-9, further comprising a die coupled to at least one metal trace among the one or more metal traces.
11. The IC package according to clause 10, wherein the die comprises one or more die interconnects each coupled a metal trace among the one or more metal traces.
12. The IC package according to clause 11, wherein:
    a first metal trace among the one or more metal traces is coupled to a ground die interconnect among the one or more die interconnects that is coupled to a ground plane in the die; and
    a second metal trace among the one or more metal traces adjacent to the first metal trace is coupled to a signal die interconnect among the one or more die interconnects that is coupled to a signal node in the die.
13. The IC package according to any of clauses 1-12, further comprising one or more input/output (I/O) interconnects each coupled a metal trace among the one or more metal traces.
14. The IC package according to any of clauses 1-13, further comprising a second die coupled to at least one second metal trace among the one or more metal traces.
15. The IC package according to any of clauses 1-14, wherein a line-spacing ratio (L/S) of each metal trace among the one or more metal traces is less than 5.0/5.0.
16. The IC package according to any of clauses 1-15 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer, a portable computer, a mobile computing device; a wearable computing device; a desktop computer; a personal digital assistant (PDA); a monitor; a computer monitor, a television; a tuner, a radio; a satellite radio; a music player, a digital music player; a portable music player; a digital video player; a video player; a digital video disc (DVD) player; a portable digital video player, an automobile; a vehicle component; avionics systems; a drone; and a multicopter.
17. A method of fabricating an integrated circuit (IC) package, comprising:
    fabricating a package substrate, comprising:
        forming a plurality of metallization layers, comprising:
            forming a first metallization layer comprising one or more first metal interconnects; and
            forming a second metallization layer comprising:
                a second metal layer; and
                one or more metal traces embedded in the second metal layer;
            coupling each of the one or more metal traces to a first metal interconnect among the one or more metal interconnects;
            forming a third layer disposed adjacent to the second metal layer, the third layer comprising one or more third metal interconnects; and
            coupling each of the one or more metal interconnects to a metal trace among the one or more metal traces.
18. The method according to clause 17, wherein forming the third layer comprises:
    forming one or more metal platings;

forming the third layer comprises forming one or more third metal interconnects comprising one or more metal platings adjacent to the second metallization layer; and
coupling each of the one or more third metal interconnects comprises coupling each of the one or more metal platings to a metal trace among the one or more metal traces.

19. The method according to any of clauses 17-18, wherein:
the second metal layer comprises a metal layer outer surface;
forming the third layer comprises forming a solder resist layer adjacent to the metal layer outer surface, the solder resist layer comprising the one or more third metal interconnects; and
coupling each of the one or more third metal interconnects comprises coupling each of the one or more third metal interconnects to the metal trace among the one or more metal traces adjacent to the metal layer outer surface.

20. The method according to clause 19, further comprising exposing the one or more metal traces from the metal layer outer surface;
wherein coupling each of the one or more third metal interconnects comprises coupling each of the one or more third metal interconnects in the solder resist layer in contact with a first metal trace surface of the metal trace.

21. The method according to clause 19, wherein forming the one or more third metal interconnects in the solder resist layer, comprises:
forming a photoresist layer on a first solder resist layer,
forming one or more openings in the photoresist layer to expose one or more first metal traces among the plurality of metal traces from the photoresist layer; and
disposing a metal material in each of the one or more openings to form the one or more third metal interconnects in the one or more openings; and
coupling each of one or more third interconnects to a metal trace among the one or more metal traces in the second metal layer.

22. The method according to clause 21, further comprising:
forming a second solder resist layer on the one or more third metal interconnects and openings of the one or more openings that do not contain a third metal interconnect;
forming a second photoresist layer on the second solder resist layer;
forming one or more second openings in the second photoresist layer to expose one or more second metal traces among the one or more metal traces from the second photoresist layer, and
coupling each of one or more die interconnects of a die to a second metal trace among the one or more second metal traces in the second metal layer.

23. The method according to any of clauses 17-18, further comprising:
forming the one or more metal traces in the second metal layer to extend in a vertical direction in the second metal layer from a metal layer outer surface to a metal layer inner surface; and
forming an insulating layer disposed adjacent to the metal layer inner surface of the second metal layer,
wherein forming the one or more third metal interconnects comprises forming the one or more third metal interconnects in the insulating layer.

24. The method according to clause 23, wherein:
forming the one or more metal traces in the second metal layer further comprises exposing a second metal trace surface of each of the one or more metal traces from the metal layer inner surface; and
coupling each of the one or more third metal interconnects comprises coupling each of the one or more third metal interconnects in the insulating layer in contact with the second metal trace surface of the metal trace among the one or more metal traces.

25. The method according to any of clause 17-24, further comprising coupling a die to the second metallization layer to couple the die to the package substrate.

26. The method according to clause 25, wherein coupling the die to the second metallization layer comprises coupling each of one or more die interconnects of the die to a metal trace among the one or more metal traces in the second metal layer.

What is claimed is:

1. An integrated circuit (IC) package, comprising:
a package substrate, comprising:
a plurality of metallization layers comprising:
a first metallization layer comprising one or more first metal interconnects; and
a second embedded trace substrate (ETS) metallization layer comprising one or more metal traces;
a third layer disposed adjacent to the second ETS metallization layer, the third layer comprising one or more third metal interconnects each coupled to a metal trace of the one or more metal traces;
a die coupled to at least one metal trace of the one or more metal traces, the die comprising one or more die interconnects each coupled to a metal trace of the one or more metal traces;
a first metal trace of the one or more metal traces is coupled to a ground die interconnect of the one or more die interconnects that is coupled to a ground plane in the die; and
a second metal trace of the one or more metal traces adjacent to the first metal trace is coupled to a signal die interconnect of the one or more die interconnects that is coupled to a signal node in the die.

2. The IC package of claim 1, wherein:
the second ETS metallization layer comprises a metal layer outer surface;
the third layer comprises a solder resist layer disposed adjacent to the metal layer outer surface; and
the one or more third metal interconnects are each disposed in the solder resist layer and adjacent to the metal layer outer surface.

3. The IC package of claim 2, wherein:
the one or more metal traces each comprises a first metal trace surface exposed from the metal layer outer surface; and
the one or more third metal interconnects in the solder resist layer are each disposed in contact with the first metal trace surface of the metal trace of the one or more metal traces.

4. The IC package of claim 1, wherein:
the second ETS metallization layer comprises a metal layer outer surface and a metal layer inner surface;
each of the one or metal traces extends in a vertical direction in the second ETS metallization layer to the metal layer outer surface and the metal layer inner surface;
the second ETS metallization layer further comprises an insulating layer disposed adjacent to the metal layer inner surface; and
the one or more third metal interconnects are disposed in the insulating layer.

5. The IC package of claim 4, wherein:
the one or more metal traces each comprise a second metal trace surface exposed from the metal layer inner surface; and
the one or more third metal interconnects in the insulating layer are each disposed in contact with the second metal trace surface of the metal trace of the one or more metal traces.

6. The IC package of claim 1, wherein each metal trace among the one or more metal traces is coupled to a first metal interconnect of the one or more of first metal interconnects.

7. The IC package of claim 1, wherein the second ETS metallization layer is disposed adjacent to the first metallization layer.

8. The IC package of claim 1, wherein the package substrate further comprises a core substrate comprising one or more core metal interconnects each coupled to a first metal interconnect of the one or more of first metal interconnects.

9. The IC package of claim 1, wherein the package substrate further comprises a coreless substrate.

10. The IC package of claim 1, further comprising one or more input/output (I/O) interconnects each coupled to a metal trace of the one or more metal traces.

11. The IC package of claim 1, further comprising a second die coupled to at least one second metal trace of the one or more metal traces.

12. The IC package of claim 1, wherein a line-spacing ratio (L/S) of each metal trace of the one or more metal traces is less than 5.0/5.0.

13. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. The method of claim 1, wherein:
forming the one or more metal traces in the second ETS metallization layer further comprises exposing a second metal trace surface of each of the one or more metal traces from the metal layer inner surface; and
coupling each of the one or more third metal interconnects comprises coupling each of the one or more third metal interconnects in the insulating layer in contact with the second metal trace surface of the metal trace of the one or more metal traces.

15. A method of fabricating an integrated circuit (IC) package, comprising:
fabricating a package substrate, comprising:
forming a plurality of metallization layers, comprising:
forming a first metallization layer comprising one or more first metal interconnects; and
forming a second embedded trace substrate (ETS) metallization layer comprising one or more metal traces;
coupling each of the one or more metal traces to a first metal interconnect of the one or more first metal interconnects;
forming a third layer disposed adjacent to the second ETS metallization layer, the third layer comprising one or more third metal interconnects; and
coupling each of the one or more third metal interconnects to a metal trace of the one or more metal traces;
forming the one or more metal traces in the second ETS metallization layer to extend in a vertical direction in the second ETS metallization layer from a metal layer outer surface to a metal layer inner surface; and
forming an insulating layer disposed adjacent to the metal layer inner surface;
wherein forming the one or more third metal interconnects comprises forming the one or more third metal interconnects in the insulating layer.

16. The method of claim 15, wherein forming the third layer comprises:
forming one or more metal platings;
forming the one or more third metal interconnects comprising the one or more metal platings adjacent to the second ETS metallization layer; and
coupling each of the one or more third metal interconnects comprises coupling each of the one or more metal platings to a metal trace of the one or more metal traces.

17. The method of claim 15, wherein:
the second ETS metallization layer comprises a metal layer outer surface;
forming the third layer comprises forming a solder resist layer adjacent to the metal layer outer surface, the solder resist layer comprising the one or more third metal interconnects; and
coupling each of the one or more third metal interconnects comprises coupling each of the one or more third metal interconnects to the metal trace of the one or more metal traces adjacent to the metal layer outer surface.

18. The method of claim 17, further comprising exposing the one or more metal traces from the metal layer outer surface;
wherein coupling each of the one or more third metal interconnects comprises coupling each of the one or more third metal interconnects in the solder resist layer in contact with a first metal trace surface of the metal trace.

19. The method of claim 17, wherein forming the one or more third metal interconnects in the solder resist layer comprises:
forming a photoresist layer on a first solder resist layer;
forming one or more openings in the photoresist layer to expose one or more first metal traces of the one or more metal traces from the photoresist layer;
disposing a metal material in each of the one or more openings to form the one or more third metal interconnects in the one or more openings; and
coupling each of the one or more third metal interconnects to a metal trace of the one or more metal traces in the second ETS metallization layer.

20. The method of claim 19, further comprising:
forming a second solder resist layer on the one or more third metal interconnects and openings of the one or more openings that do not contain a third metal interconnect;
forming a second photoresist layer on the second solder resist layer;

forming one or more second openings in the second photoresist layer to expose one or more second metal traces of the one or more metal traces from the second photoresist layer; and coupling each of one or more die interconnects of a die to a second metal trace of the one or more second metal traces in the second ETS metallization layer.

21. The method of claim 15, further comprising coupling a die to the second ETS metallization layer to couple the die to the package substrate.

22. The method of claim 21, wherein coupling the die to the second ETS metallization layer comprises coupling each of one or more die interconnects of the die to a metal trace of the one or more metal traces.

* * * * *